US008300439B2

(12) United States Patent  
Little et al.

(10) Patent No.: US 8,300,439 B2
(45) Date of Patent: Oct. 30, 2012

(54) DATA ACQUISITION APPARATUS AND METHODOLOGY FOR SELF-DIAGNOSING OF AC MODULES

(75) Inventors: Ruel Davenport Little, Concord, MA (US); Zachary Adam King, Townsend, MA (US)

(73) Assignee: GreenRay Inc., Westford, WA (US)

( * ) Notice: Subject to any disclaimer, the term of this patent is extended or adjusted under 35 U.S.C. 154(b) by 402 days.

(21) Appl. No.: 12/450,002

(22) PCT Filed: Feb. 27, 2008

(86) PCT No.: PCT/US2008/002616
§ 371 (c)(1),
(2), (4) Date: Jan. 4, 2010

(87) PCT Pub. No.: WO2008/112080
PCT Pub. Date: Sep. 18, 2008

(65) Prior Publication Data
US 2010/0106339 A1    Apr. 29, 2010

(51) Int. Cl.
*H02M 7/44* (2006.01)
*H02J 3/38* (2006.01)
*H05K 7/20* (2006.01)
(52) U.S. Cl. ............ 363/71; 363/95; 363/141; 363/144; 307/82
(58) Field of Classification Search .................. 136/252; 307/82; 363/55, 65, 71, 95, 123, 141, 144, 363/178; 700/286, 297
See application file for complete search history.

(56) References Cited

U.S. PATENT DOCUMENTS

| | | | |
|---|---|---|---|
| 4,052,657 A * | 10/1977 | Kleiner et al. | 363/43 |
| 4,170,225 A | 10/1979 | Criglar et al. | |
| 4,404,472 A | 9/1983 | Steigerwald | |
| 4,499,658 A | 2/1985 | Lewis | |
| 5,268,832 A | 12/1993 | Kandatsu | |
| 5,505,208 A | 4/1996 | Toomim et al. | |
| 5,551,445 A | 9/1996 | Nashner | |
| 5,573,011 A | 11/1996 | Felsing | |
| 5,593,532 A | 1/1997 | Falk et al. | |
| 5,733,382 A | 3/1998 | Hanoka | |
| 5,896,281 A * | 4/1999 | Bingley | 363/71 |
| 6,010,468 A | 1/2000 | Grove et al. | |
| 6,031,736 A | 2/2000 | Takehara et al. | |
| 6,259,017 B1 * | 7/2001 | Takehara et al. | 307/82 |
| 6,285,572 B1 | 9/2001 | Onizuka et al. | |
| 6,307,144 B1 | 10/2001 | Mimura et al. | |
| 6,570,270 B2 | 5/2003 | Takebayashi | |
| 6,657,118 B2 | 12/2003 | Toyomura et al. | |
| 6,750,391 B2 * | 6/2004 | Bower et al. | 136/244 |
| 6,761,581 B2 | 7/2004 | Takehara et al. | |
| 6,809,942 B2 | 10/2004 | Madenokouji et al. | |

(Continued)

FOREIGN PATENT DOCUMENTS

WO    WO 2008/108909    9/2008

*Primary Examiner* — Adolf Berhane
*Assistant Examiner* — Fred E Finch, III
(74) *Attorney, Agent, or Firm* — Armstrong Teasdale LLP

(57) ABSTRACT

Method and apparatus for monitoring, measuring and recording the operating values of each of a plurality of inter-connected AC PV modules and performing a diagnostic analysis, including comparing the those operating values to each other and to operating values recorded at an earlier time to determine laminate degradation and the performance-attenuating effect of temperature, soiling, shading, and snow cover on the modules.

35 Claims, 13 Drawing Sheets

INVERTER MEASUREMENT AND CONTROL BLOCK DIAGRAM

*DSP - Digital Signal Processing
Microprocessor has internal temperture measurement built in.

Power line processor/transceiver consists of an 8-bit microprocessor core for running applications and managing network coomunications, and a highly reliable narrow-band powerline transceiver. The power line transceiver interface circuit allows the transceiver chip to safely connect to 120Volts AC.

U.S. PATENT DOCUMENTS

| | | |
|---|---|---|
| 6,838,611 B2 | 1/2005 | Kondo et al. |
| 6,914,418 B2 | 7/2005 | Sung |
| 6,930,237 B2 | 8/2005 | Mattiuzzo |
| 7,193,872 B2 * | 3/2007 | Siri ................................ 363/95 |
| 2003/0002310 A1 | 1/2003 | Madenokouji et al. |
| 2004/0207366 A1 | 10/2004 | Sung |
| 2005/0105224 A1 | 5/2005 | Nishi |
| 2006/0042683 A1 | 3/2006 | Gangemi |
| 2006/0162772 A1 | 7/2006 | Presher, Jr. et al. |
| 2006/0219291 A1 | 10/2006 | Hikosaka et al. |
| 2007/0177338 A1 | 8/2007 | Nishi et al. |
| 2007/0179720 A1 | 8/2007 | Becker et al. |
| 2007/0236187 A1 | 10/2007 | Wai et al. |
| 2007/0252716 A1 | 11/2007 | Burger |

* cited by examiner

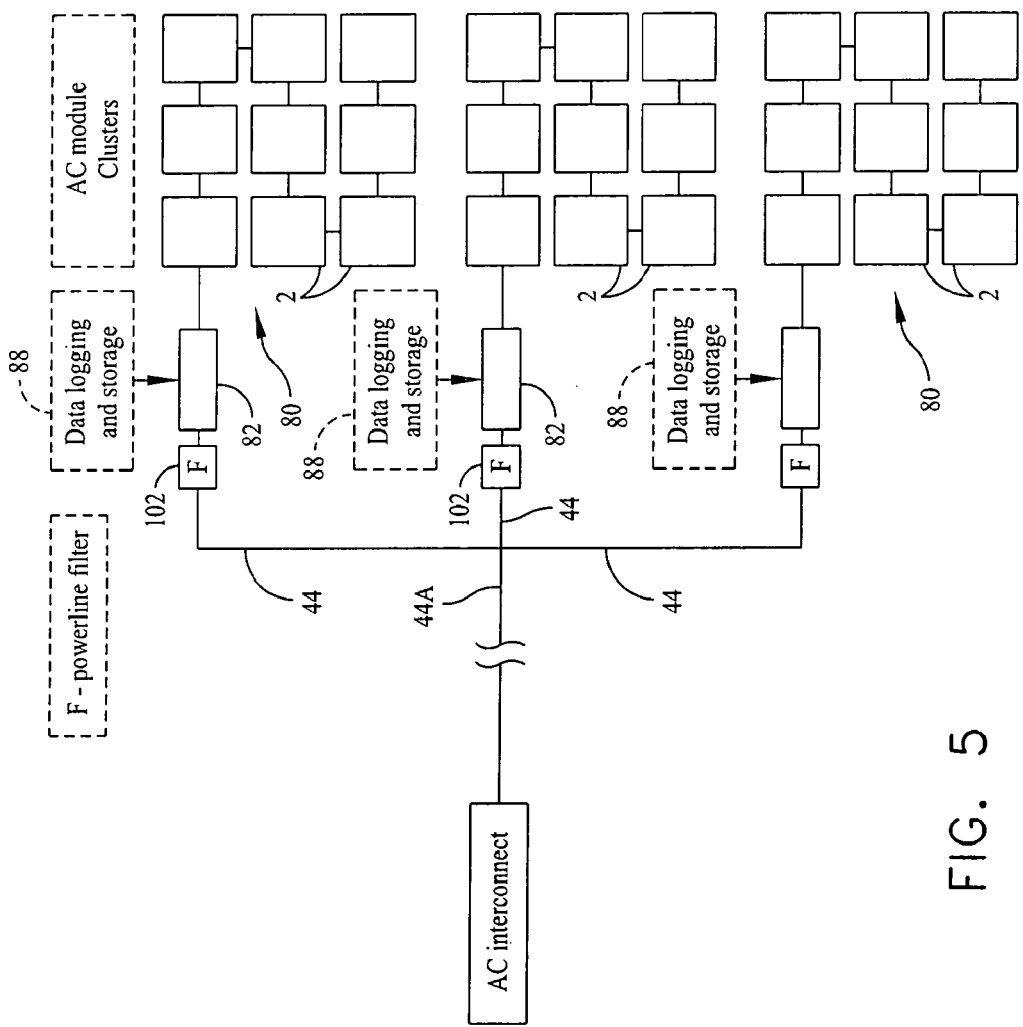
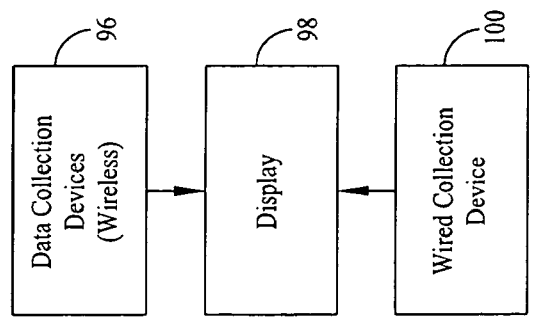
FIG. 5

DATA ACQUISITION APPARATUS AND METHODOLOGY FOR SELF-DIAGNOSING OF AC MODULES

FIELD OF INVENTION

This invention relates generally to photovoltaic power generating systems and more particularly to an apparatus and method for acquiring and processing performance and related data from a plurality of electrically interconnected AC photovoltaic modules for the purpose of monitoring the state and performance of individual modules and determining the affect on each module from performance-attenuating events.

BACKGROUND OF THE INVENTION

Typical photovoltaic power generating installations comprise a plurality of electrically interconnected photovoltaic (PV) modules. An elemental photovoltaic module is comprised of a laminate that includes a plurality of electrically interconnected photovoltaic (solar) cells that generate a DC power output in response to received solar radiation. Commonly a PV module includes a supporting frame that surrounds the laminate at its periphery. The conventional arrangement comprises connecting all of the PV modules in a given installation to a single inverter which is designed to convert the combined DC power outputs of the modules to an AC power output of selected voltage and frequency.

However, such real-world photovoltaic systems experience performance faults associated with wiring, mounting, orientation, shading, soiling, and snow among others, as well as individual PV module deterioration due to aging, temperature cycling and other factors. Therefore, system diagnosis and monitoring would be of benefit to both the customer and the installer.

Current systems for monitoring and troubleshooting photovoltaic power generating installations require inverters that can monitor and measure inverter temperature and status as well as electrical voltage and current values and also dataloggers that record the information generated by the inverter. Commonly the dataloggers are located inside the building on top of which the photovoltaic power generating system is mounted.

Currently available inverters typically employ a microprocessor-controlled means for measuring DC and AC values and inverter temperature and for communicating that information in digital form to dataloggers or to other devices for storing or displaying data, e.g. RS232, RS485, power line, Ethernet, and wireless communication systems. However, power line communications in residential environments pose a number of complex issues. The primary issue is that the AC power line is inherently a noisy environment. The quality of the signal that is transmitted over power lines is dependent on the number and type of the electrical devices (televisions, computers, hair dryers, etc.) connected to the power lines and switched on at any given time. When appliances in a house turn on or off, they introduce pops and clicks onto the AC utility signal. Energy saving devices often introduce noisy harmonics as well. The system must be designed to manage these common signaling disruptions.

Various types of dataloggers are used with photovoltaic power generating systems. The datalogger may communicate with the inverter by a hard wired connection or wirelessly. The datalogger may be used to record only the inverters' electrical data measurements or it may also be used to record other values such as sunlight and ambient temperature. Various types of display devices also may be used that offer user interaction with the system performance.

Unfortunately current methods of monitoring and diagnosing problems with a PV power generating system comprising a plurality of interconnected PV modules and a single inverter only provide a macro view of the system performance, which includes the inverter, the array and the operating environment as a whole. In a typical monitoring and troubleshooting system, the AC, DC, and environmental measurement components are separated. In other words, the single inverter measures AC and DC values of the combined power output of the interconnected PV modules, but not that of individual PV modules which are physically remote from the inverter. Also the single inverter can measure its own internal temperature but not the temperature of the remote individual modules. Some dataloggers may be adapted for connection to external sensors that record environmental information outside the inverter, usually at a single point, for a whole array of PV modules. Typically such external sensors are mounted at locations determined by the installer and require the installer to run electrical wires from the sensors to the datalogger, so that the value of the sensors is subject to the quality of the installation. Obtaining module level information is too expensive to implement and cumbersome to manage, requiring extensive wiring and additional components such as a temperature sensor for each DC-power generating PV module.

An alternative arrangement comprises connecting each of a plurality of PV modules to its own dedicated inverter, and combining the AC outputs of those inverters for subsequent transmission to a utility grid or a local power load. Each combination of a PV module and its dedicated inverter is identified herein as an AC PV module. A system arrangement comprising a plurality of AC PV modules has many advantages. One such advantage is that each inverter can monitor and measure all input DC and output AC values of an AC PV module as well as inverter temperature, and communicate that measured data to a datalogger or other device that is capable of collecting that data and transferring it to a central database, and/or storing and displaying it locally. However, heretofore there has been lacking a comprehensive method and apparatus for acquiring data from a plurality of AC PV modules that accomplishes detailed self-diagnosis of each module, including measuring, datalogging and communicating data representing AC PV module performance.

OBJECTS AND SUMMARY OF INVENTION

A primary object of the invention is to provide a data measurement, datalogging and communications method and apparatus comprising a novel approach to data acquisition for a plurality of AC PV modules that accomplishes detailed self-diagnosis of each AC PV module.

Another object of the invention is to provide a method and apparatus for monitoring a PV power generating system comprising a plurality of AC PV modules characterized by a self-diagnosis capability that includes common difficult-to-measure performance-attenuating events such as temperature, soiling, shading, snow cover and laminate degradation.

Still another object is to provide a method and apparatus for monitoring a PV power generating system characterized in that the AC PV modules are grouped together, i.e., clustered, for electrical and mounting purposes, and data is collected from each AC PV module and stored and analyzed at the module level and also the cluster level.

Still another object is to measure the characteristics of each AC PV module and store those characteristics and other identifying data in the module's dedicated inverter at the factory where the module is manufactured, and to employ that information in monitoring the performance of the module after it has become part of a PV power generating installation. Measuring initial AC PV module characteristics at the factory assures conformity of measurement that is not available in the field.

A more specific object is to provide a photovoltaic AC power generating network comprising one or more clusters of AC PV modules, where each cluster comprises a plurality of AC PV modules each having its own inverter, with the inverters being interconnected to provide a combined AC power output, characterized in that the network comprises and utilizes an apparatus and method for monitoring, measuring and recording the condition and performance of each module as well as providing a capability of determining the affect on each module from performance-attenuating events, e.g., temperature, soiling, shading, snow cover and laminate degradation.

A further object is to provide a data acquisition method and apparatus that is capable of administering firmware upgrades for the AC PV modules as well as providing a record of system environmental conditions for warranty claims.

These and other objects hereinafter described, implied or rendered obvious by the following detailed description are achieved by providing a power generating system comprising a plurality of AC PV modules with a method and apparatus for acquiring and processing operating and environmental data from individual AC PV modules characterized in that the modules are grouped into clustered arrays each having two or more AC PV modules, with the operating and other data collected from each module in a cluster being stored separately from the data collected from modules in other clusters. From an evaluation and diagnostic standpoint, the AC PV modules are clustered, i.e., grouped together, based on location, proximity, orientation, tilt, ambient temperature, mounting system and/or AC line voltage. Preferably the modules in a cluster are located in proximity to one another so as to be subject to and operate in a similar environment and exposed to the same or substantially the same sunlight conditions. Clustering the data from modules permits a comparison that reveals or provides an aggregate performance self-diagnosis. The AC PV modules in a cluster are connected electrically on a single AC power bus which not only aggregates the AC power output of all the modules in the array but also acts as a communications bus for the date output of all the inverters in the cluster.

The invention's method for self-diagnosis involves the following operations: (1) environmental and operational measurements of both the inverter and the laminate of each module are compared to the roof ambient temperature to create an operation signature that is matched to a type of system performance degradation; (2) individual module performance is compared to peers in its own cluster to determine if there are modules that are under-performing, which is advantageous since comparison of an AC PV module among its peers using operational and environmental measurements deductively reveals performance-degrading events such as soiling, shading, snow cover and laminate degradation; and (3) a separate datalogger associated with each cluster compares the historical data of the under-performing module(s) to analyze their relative performance, preferably comparing current values to those for 24 hours previous (diurnal cycle) and 1 hour previous. The historical trend reveals reoccurring daily events, for example: startup (sun up), and shutdown (sun down). The 1 hour previous comparison will reveal environmental change of the module.

A further aspect of the invention is that it includes provision of a communications network among the AC PV modules in each cluster that sends diagnostic information about each module to a storage and data processing device, whereby the sum of the clusters of AC PV modules constitutes a virtual larger diagnostic system which can use the data from and similarity of AC PV modules as a powerful self-analysis tool. Diagnostic information percolates up the system chain to provide specific insights to the operation and performance of the total photovoltaic installation as well as specific information about the operation and management of each module in the system.

Still another aspect of the invention is that each AC PV module inverter includes a PV laminate temperature sensor that is embedded at the factory, with each module having the same type of sensor, whereby the inverters of the AC PV modules are able to report identically recorded values of module performance and properties, e.g., DC voltage, DC current, AC voltage, AC current, AC energy, inverter temperature, inverter status, laminate or cell temperature, resulting in data that can be compared among AC PV modules operating in a similar environment, with the measurements being made by each inverter without error-prone field wiring or error-prone installer sensor placement. The apparatus also provides all necessary on-site data storage and communications for the duration of the expected 20-year lifetime of a PV module system.

Another aspect of the invention is the provision of a datalogger that communicates with the AC PV modules over an AC power bus using power line communications, an AC noise filter that filters out noise on the grid-side of the AC power bus that might otherwise interfere with the data transmission the AC PV modules, a temperature sensor that records outdoor temperature near the junction box, and a capability of networking with other like junction boxes. A wired, serial communication connection to the datalogger in the junction box assures that the data recorded in the datalogger is accessible through standard protocols for the life of the system.

A further aspect and feature of the invention is that all AC PV module inverter measurements relate to the performance of a single AC PV module and no other components of the total power generating system affect the performance of that single module. Furthermore, when aggregating the performance of a plurality of AC PV modules, performance attenuation in one AC PV module does not affect the performance of other AC PV modules in the system.

Other features, aspects and advantages of the invention are set forth in or rendered obvious by the following detailed description.

THE DRAWINGS

FIG. 5 is a schematic representation of a plurality of arrays of AC PV modules networked together via their common junction boxes to form a larger AC power generating system.

In the drawings, like parts are designated by like numerals.

DEFINITIONS

As used herein the term "PV laminate" means and denotes an integral unit in the form of a laminate that comprises at least a front transparent layer, a plurality of encapsulated electrically interconnected photovoltaic (solar) cells that generate a DC electrical power output in response to received solar radiation, and terminal electrical conductors for recovering that electrical power output and transmitting it for processing and/or use. As used herein the term "PV module" means and denotes a unitary device comprising a single PV laminate, or two or more adjacent and co-planar electrically connected PV laminates, with or without a protective and supporting frame surrounding the laminate(s). As used herein the term "AC PV module" means and denotes the combination of a PV module and an inverter dedicated to converting the DC power output of only that PV module to AC power. As used herein the term "cluster of AC PV modules" means and denotes a plurality of AC PV modules connected together by a common AC output bus. Preferably the modules in each cluster are located in proximity to one another so as to better assure that they will experience the same environmental conditions. As used herein, the term "photovoltaic AC power generating network" means and denotes two or more clusters of AC PV modules that are interconnected to supply AC power to a power grid or to a local load, e.g., the electrically powered pumps and other equipment of a water desalinization plant.

DETAILED DESCRIPTION OF THE INVENTION

The present invention is premised on the provision of a plurality of PV modules and a plurality of electrical inverters each disposed to convert the DC power output of an individual module to AC power. Each PV module may comprise a single PV laminate or a plurality of PV laminates. Details of construction of the laminates are omitted since the specific construction of the laminate is not critical to the invention. Accordingly it is to be understood that various forms of PV laminates may be used in the practice of the invention. By way of example but not limitation, the PV laminates may be manufactured as disclosed by U.S. Pat. Nos. 4,499,658, issued Feb. 19, 1985 to K. J. Lewis for Solar Cell Laminates; U.S. Pat. No. 5,733,382, issued Mar. 31, 1998 to J. I. Hanoka for Solar Cell Modules and Method of Making Same; U.S. Pat. No. 5,593,532, issued Jan. 14, 1997 to J. Falk et al. for Process of Manufacturing Photovoltaic Modules; and U.S. Patent Application Publication No. US 2006/0219291 of M. Hikosaka et al. for Photovoltaic Module, published Oct. 15, 2006.

Figure 1:
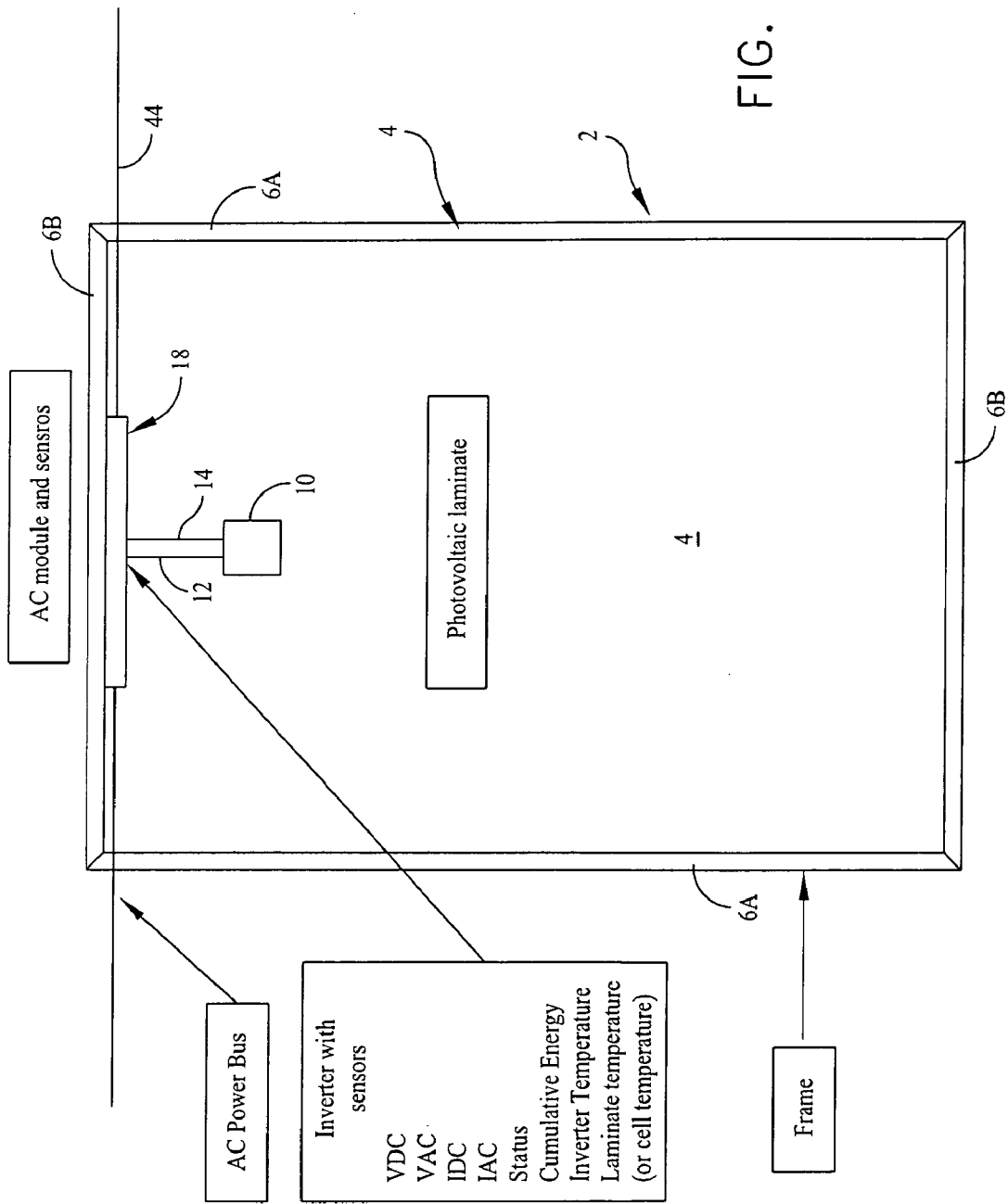
FIG. 1 is a schematic view of the rear side of an AC PV module illustrating the location of its inverter.
Figure 2:
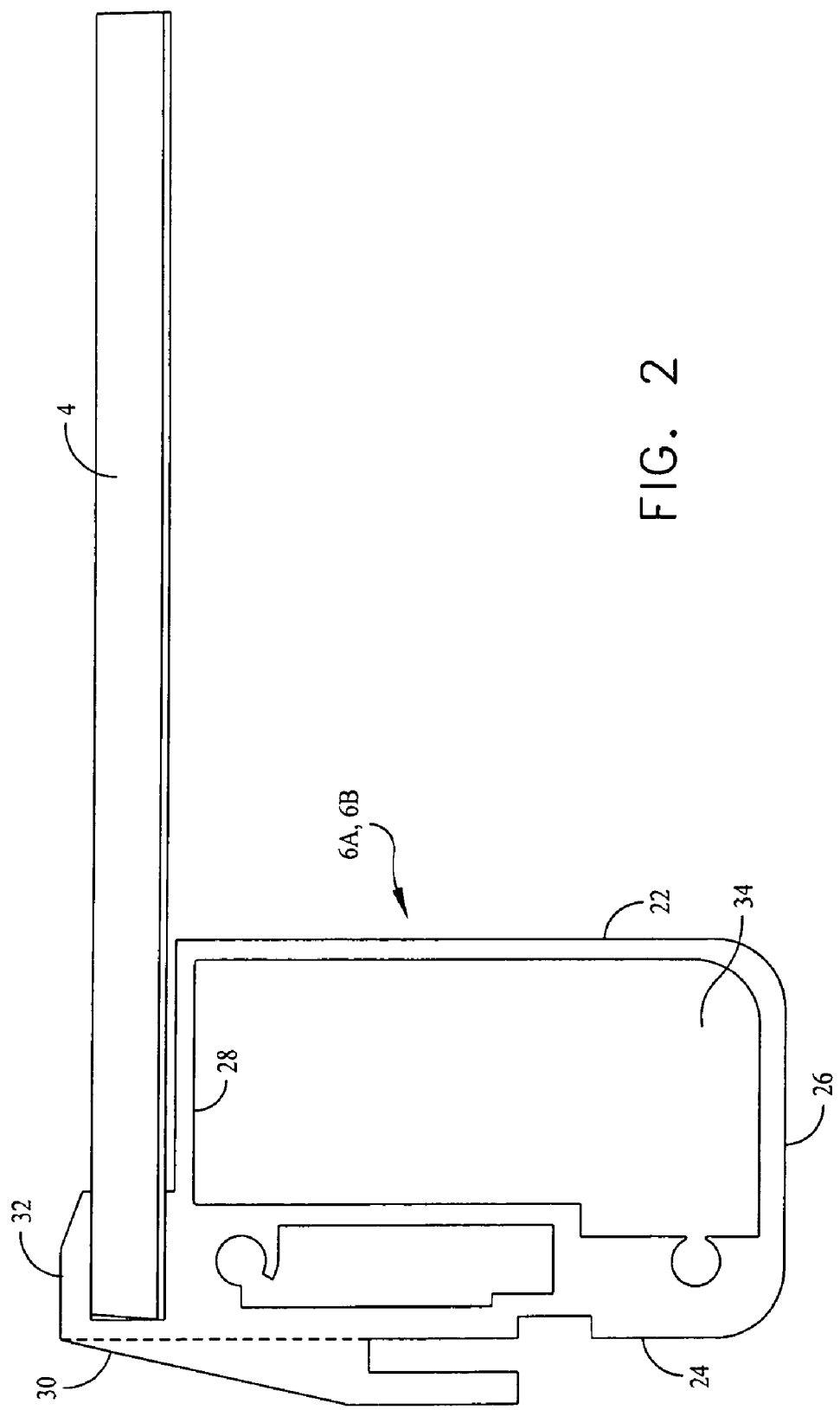
FIG. 2 is a fragmentary cross-sectional view of the same AC PV module.
Figure 3:
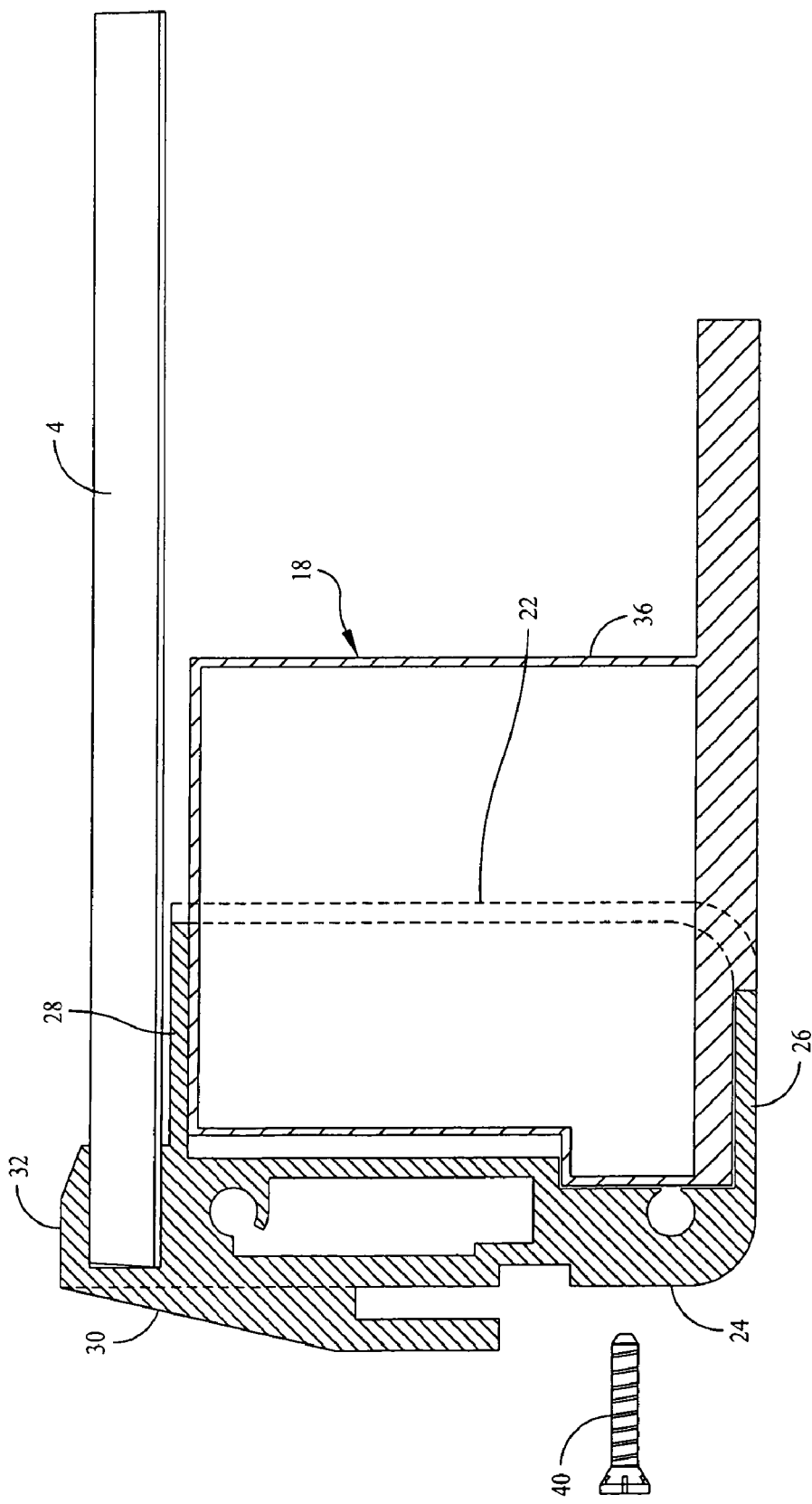
FIG. 3 is a fragmentary cross-sectional view showing the inverter mounted to the frame of the module.

Referring now to FIGS. 1-3, the AC PV module 2 illustrated therein comprises a rectangular PV laminate 4 surrounded by a frame that comprises four frame members that are arranged end-to-end, with two opposite side frame members 6A extending at a right angle to the two end frame members 6B. As shown in FIG. 1, on its rear side the laminate has a terminal section 10 from which extend two output cables 12 and 14 that are connected to input terminals of an inverter unit 18. Cables 12 and 14 conduct the DC electrical output of the interconnected cells (not shown) of the PV laminate to the inverter unit.

The frame members 6A and 6B may take various forms, but preferably they are formed and secured together in the manner shown in co-pending PCT International Application No. PCT/US 08/01678, filed Feb. 8, 2008 by GreenRay, Inc. for "Multi-function Frame And Integrated Mounting System For Photovoltaic Power Generating Laminates", the disclosure of which is incorporated herein by reference. Using a frame as disclosed in said co-pending application PCT/US 08/01678 facilitates the mounting thereto of inverter unit 18 as hereinafter described. Accordingly the frame members are made of aluminum (but they could be made of some other material, e.g., steel). FIGS. 2 and 3 show a preferred form of frame member construction. The frame members 6A and 6B are aluminum extrusions and have the same cross-sectional configuration, comprising a box channel section that consists of a pair of sidewalls 22 and 24, a bottom wall 26, and a top wall 28, and a laminate-retaining section comprising a sidewall 30 that is an extension of the sidewall 24 and a right angle flange 32. The upper surface of top wall 28 is flat and coacts with the laminate-retaining section 30, 32 to define a laminate-receiving channel for receiving the edge portion of the laminate 4. The laminate-receiving channel may be sized so that the edge of the laminate makes a snug fit therein, but preferably a resilient sealing compound or a gasket (not shown) surrounds the edge of the laminate in the channel.

As shown in FIG. 3, the inner side wall 22 of one of the end frame members 6B is removed over a selected length of the frame member so as to provide an opening whereby the inverter unit 18 may be inserted into the channel formed by side wall 24, bottom wall 26, and top wall 28. The remaining portion of inner side wall 22 is indicated in phantom in FIG. 3. In the illustrated embodiment, the inverter unit 18 is mounted within a housing 36 that is made of an electrically conductive metal and is secured to side wall 24 by screws 40 that extend through holes in side wall 24 and screw into the housing. The mechanical connection made by the inverter housing 36 with side wall 24 and also walls 26 and 28 of the frame member 6B results in that frame member serving as a heat sink and also provides an electrical ground for the inverter unit.

It is contemplated that a plurality of AC PV modules may be arranged in rows and/or columns on a roof or other support in substantially like angular positions relative to the roof. For the purposes of this invention, in a given installation a plurality of AC PV modules will be grouped in one or more clusters (see FIG. 5), with the modules in each cluster linked together electrically to form a larger power generating entity whose output is the combined output of all the modules in the cluster. As noted previously, preferably a cluster consists of a number of modules that are in physical proximity to one another, e.g., within one or two feet from each other. Referring again to FIG. 1, electrical interconnection of the modules in a cluster may be facilitated by assembling each module at the factory with a multi-wire cable that is connected to the output side of its dedicated inverter 18 and is available for connection to like cables connected to inverters of other modules in the same array so as to form a common AC power bus 44. At each module the multi-wire wire cable that forms part of the AC power bus is disposed within the channel 34 defined by wall sections 22, 24, 26, and 28 of the frame member 6B to which the inverter unit is mounted.

Figure 4:
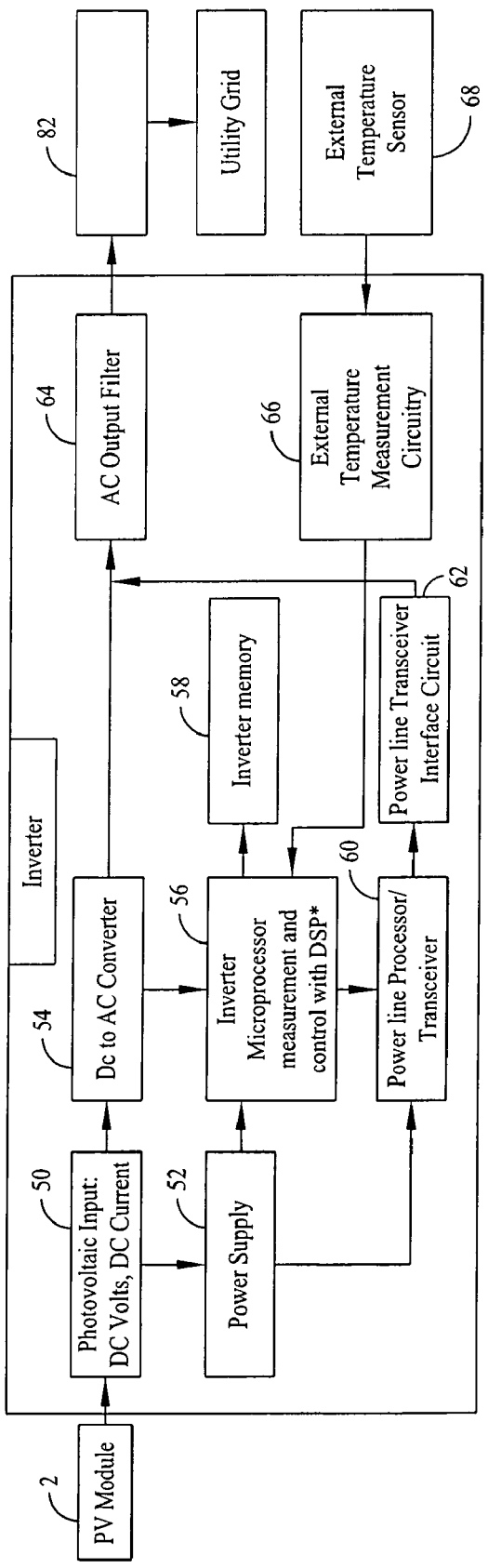
FIG. 4 is a schematic view of the components of the same inverter.

The method of self-diagnosis of the present invention is premised on collecting and utilizing key performance data of each module in a cluster. This key performance data collection is accomplished using an inverter unit as shown in FIG. 4. Referring now to FIG. 4, the inverter unit comprises an input terminal 50 which is connected to the PV module 2. The DC output from the PV module is used to drive a power supply 52, and is also applied to a DC to AC converter 54. A microprocessor 56 controls operation of converter 54 and other components of the inverter unit and serves to digitize sensed DC and AC values. A memory unit 58 is connected to the microprocessor and serves to store the inverter unit data as provided by the microprocessor. In this connection it should be noted that each AC PV module element has factory-characterized parameters stored in the inverter memory 58, notably open circuit DC voltage (Voc), short circuit DC current (Isc), maximum power voltage (Vmp), maximum power current (Imp), maximum power (Pmp) and the irradiance and laminate temperature conditions of the factory-characterization. The maximum power voltage is the total DC voltage of the PV laminate when generating its maximum power for a given irradiance and laminate temperature. The maximum power current is the DC current through the PV laminate when it is generating its maximum power for a given irradiance and laminate temperature. The maximum power (Pmp) is the DC power (Vmp×Imp) when the laminate is generating maximum power for a given irradiance and laminate temperature. Each module also has a serial number, date of manufacture and warranty information stored in inverter memory 58.

The power supply 52 also provides power to a power line carrier and transceiver unit 60. The latter is controlled by the microprocessor 56 and is connected to a power line carrier interface circuit 62 which processes data received from the transceiver unit and applies it to the AC output bus 44. The latter is connected via a junction box 82 (FIGS. 5, 6) to a power grid or some other electrical load. The purpose of the AC filter 64 is to prevent AC noise generated by the converter and other components of the inverter unit from affecting the quality of the power grid and the data transmitted by the power line carrier interface circuit. The inverter system shown in FIG. 4 also includes an internal temperature sensor (not shown) which is part of the microprocessor and senses the temperature of the inverter and also an external temperature measurement circuit 66 which is connected to an external temperature sensor 68 that is mounted to the module in position to sense the temperature of the PV laminate or of the solar cells that are encapsulated in the laminate. The temperature measurement output of circuit 66 is fed to the microprocessor 56 for storage into memory and also for ultimate use as hereinafter described.

FIG. 5 illustrates a photovoltaic AC power generating network that embodies the present invention. The network comprises a plurality of clusters 80 of AC PV modules 2 that are interconnected to supply AC power to a power grid or to a local load. In each cluster the modules are connected to a common power bus 44. The last in line of the modules in a cluster is connected by the power bus 44 to a junction box 82. Each cluster has its own junction box 82 located close to the cluster. The several junction boxes are connected in parallel by extensions of the power bus 44 to a total power output cable 44A that transmits the combined AC power output of the modules of the three arrays to a power grid or other power-using circuits or load. Each junction box 82 comprises a datalogger 88.

Figure 6:
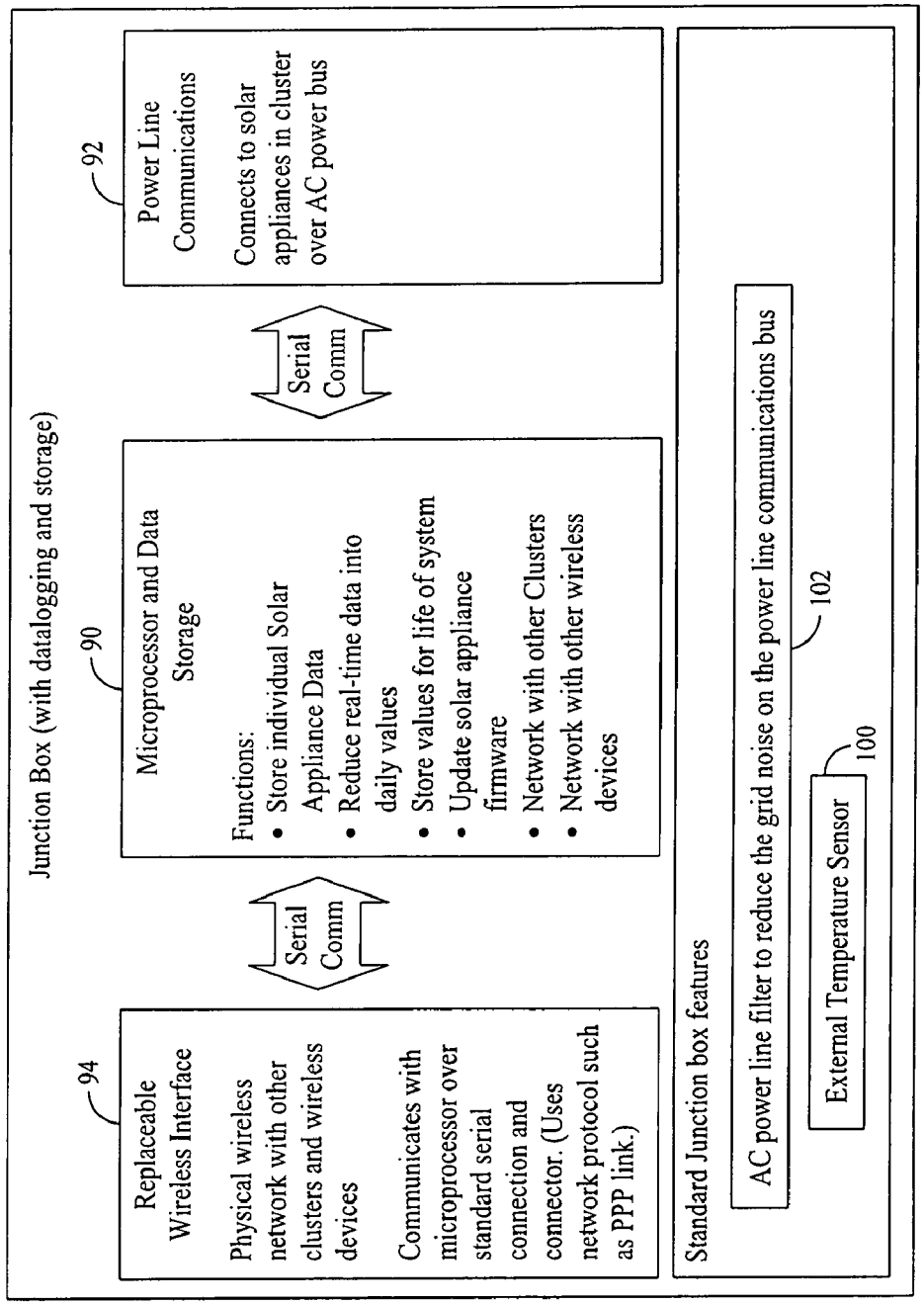
FIG. 6 is a schematic representation of a junction box.

FIG. 6 schematically illustrates the components of datalogger 88 of each junction box 82. The datalogger comprises a micro processor and data storage memory unit 90 that is programmed to store individual module data (preferably for the life of each module in the cluster to which the junction box is connected), evaluate the stored values in the manner hereinafter described with reference to FIGS. 8A, 8B, 8C, 8D and 8E, network with other cluster of modules and also other wireless devices, and update firmware in the datalogger and the inverters to which it is connected. The junction box also contains a power line communications transceiver unit 92 that is hard wire connected to the power bus 44 of a duster and is adapted to recover digital data communicated over that power bus by the power line transceivers 60 of the several inverters of the multiple module cluster. Power line communications transceiver unit 92 is in serial communication with the microprocessor and data storage memory unit 90 via a hard wire connection. The datalogger further includes a wireless interface unit 94 that is in serial communication with micro processor and data storage memory unit 90 via a hard wire connection. The wireless interface unit is adapted to wirelessly transmit digital data received from the micro processor and data storage memory unit 90 to a wireless data collection device 96 (FIG. 5) located at any convenient location, e.g., within the building on which the modules are mounted, or at an off-site near or remote location.

As noted in FIG. 5, the data collection device 96 is connected to a system interface and display unit 98 whereby data stored in the data collection device may be accessed and displayed for the benefit of the owner of the PV power generating network or the person responsible for its oversight and maintenance. The wireless interface unit 94 also is capable of networking wirelessly with like wireless interface units in other junction boxes in a multiple cluster installation. The wireless interface unit may use any common network protocol to communicate with other wireless interface units or data collection devices, e.g., PPP link. As a further alternative, it is contemplated that if a wireless digital data transmission capability is lacking, the digital data from each cluster may be transmitted via a hard wired connection (not shown) from the micro processor and data storage memory unit 90 to a data collection device 100 (FIG. 5) located at a selected point away from the modules or to the datalogger of other junction boxes 82.

In addition to the foregoing components, the junction box also includes an external temperature sensor 100 which is connected to datalogger 88 and monitors the outdoor temperature near the array of AC PV modules, preferably the temperature of the roof or other supporting structure on which the junction box is mounted; alternatively the temperature sensor of the junction box may be positioned to monitor the temperature of the junction box per se if the latter is mounted directly to the roof or other supporting structure. The temperature sensed by sensor 100 is supplied to and stored in micro processor and data storage memory unit 90 of the datalogger. In the preferred embodiment of the invention, a second AC power line filter 102 is inserted in the AC bus 44 between the datalogger 88 and the power grid or other AC power-using circuits or load to reduce the effect of grid noise on the data being processed by the datalogger 90.

The data acquisition method and the self diagnosis methodology consists of two essential processes: (1) acquisition of operational and environmental data from each AC PV module, and (2) then evaluating that data to diagnose inverter and module faults in the manner hereinafter described.

Figure 7:
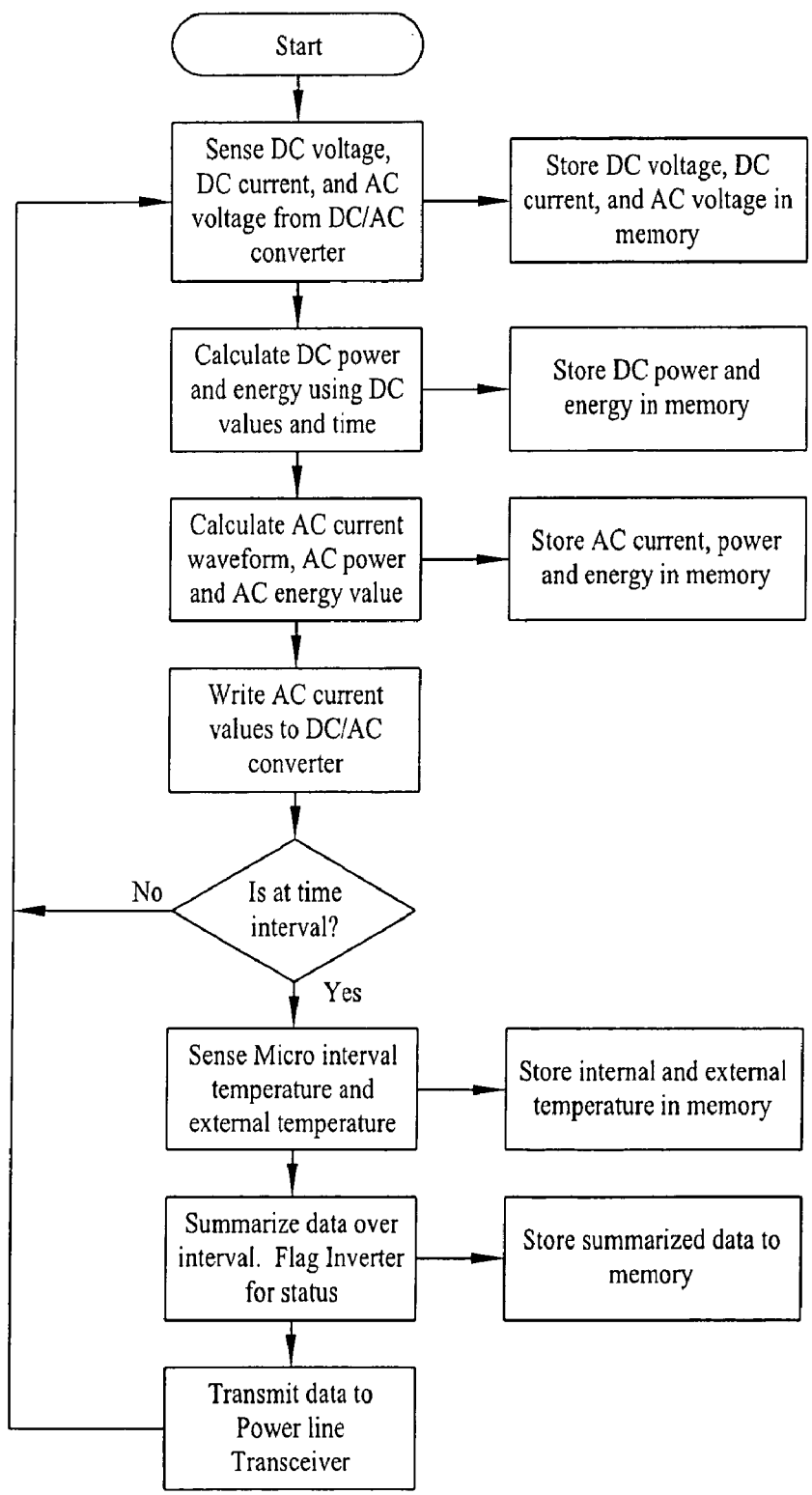
FIG. 7 is a flow chart of the program embodied in the same inverter.

FIG. 7 relates to the initial process of acquiring data from each module and illustrates the flow diagram of the operating software of the inverter unit shown in FIG. 4. That operating software is stored in the memory 58 and utilized by microprocessor 56 in controlling operation of the inverter. The microprocessor directs operation of the converter 54 in converting the DC electrical output of the associated PV laminate to an AC current of predetermined voltage and frequency. Additionally the microprocessor obtains the DC voltage, DC current and AC voltage values from the DC/AC converter 54, and then calculates the DC power and energy (in digital form)

using the DC values and time. Those values are stored in memory 58. Next the AC current waveform, AC power and AC energy values are calculated in digital form, the AC current power and energy values are stored in memory 58, and the current AC values are written to the DC/AC converter. The microprocessor repeats the foregoing process of storing values at a selected frequency, e.g., every minute, until a predetermined time interval has expired, whereupon the internal and external temperatures are sensed, and stored in inverter memory 58. The DC and AC data that was collected and stored over the period of that time interval and the internal and external temperatures are summarized, stored in inverter memory 58, and transmitted to the power line transceiver 60. All of the data sent to transceiver 60 is in digital form. If an inverter fault is detected, the inverter flags that fault status and that flagged status also is transmitted to the power line transceiver.

In this connection it is to be noted that, as explained hereinafter, the invention discriminates between the inverter faults and module faults. The invention's method for self-diagnosis of cluster and module performance using current and stored AC PV module data involves two levels of diagnosis: (1) AC module cluster and (2) individual modules in a cluster. The module cluster level diagnosis identifies performance degrading events by looking at the relative performance of each module in the cluster. With an identified performance fault, each module is then evaluated to identify a specific fault and then tagged with its contribution to the overall fault of the array.

The diagnostic method is based on a first assumption that all modules in a cluster operate correctly. It is assumed that there will be some variations in performance due to manufacturing differences between the modules. Therefore, the data acquisition method and system must create a normalization cluster power matrix with these variations in order to remove them when comparing AC modules. This normalization is best performed once over a period of time after the cluster of AC modules is installed. A simple method for this is to record power output from each module on a periodic basis when the sun is high in the sky. The matrix is normalized by selecting a power output from the AC modules that approximates a solar energy resource of 700 W/m² (approximately 70% power based on factory rating), which is representative of the power output when the sun is high in the sky and close to solar noon. The advantages of normalizing the module with a high sun are several: the sun is near perpendicular to the module surface, the signal from the modules is high, small variations in module orientation affect the power output less when the sun is high in the sky, and shading is less likely to occur near solar noon, among other things.

The second assumption of the diagnostic method of the invention is that a normally operating cluster consisting of AC PV modules that are located close to each other, and are in the same general orientation, should have similar operating characteristics of power, laminate temperature, and inverter temperature.

In uncovering a module fault condition, power is the metric used to compare all modules in a cluster (note: average power over a period of time is equivalent to energy). Therefore, each module's power is tested against the maximum power producing module in the cluster to see if a module differs by a significant amount using the following formula:

$$P_{module}/P_{max} < 1-e, \text{ where } e \text{ is defined by the user.}$$

If the formula is true then the module is considered to be in a power fault state. Note that a threshold for power may also be set. For example, the power test may require that $P_{max}$ be at least 10% of the nameplate (factory) rating of the AC module before applying the foregoing formula.

In addition to looking at the difference in power between the modules, the diagnosis procedure involves looking at the difference in temperature between the laminate (or solar cell) temperature of the module producing the maximum AC power and the corresponding temperature of the underperforming AC module using the following formula:

$$(T_{max}-T_{laminate})*P_{nameplate}/P_{max} = \Delta T_{laminate}$$

The purpose of factoring in the $\Delta T_{laminate}$ is to reveal whether the tested low power module is significantly cooler or warmer than or similar to the $P_{max}$ module. Since sunlight is the source of heat on the module, a cooler module will indicate that less sun is hitting the module and a hotter module could indicate a hot mounting location for that module. In addition, the formula weights the temperature difference by a normalized power (which is proportional to sunlight).

Each module is tagged for power faults which are divided into two categories, inverter faults, and module faults. An inverter fault is a fault detected directly by the inverter unit or where the inverter prevents the module from delivering power (see the following Table of Inverter Faults). An inverter fault will result in a reduced or zero power output. The only inverter fault that does not uniquely identify the reason for the fault is the DC under (i.e., low) voltage, since that fault can be due to a module fault. Inverter faults are detected and flagged by the inverter microprocessor 56 according to the flow diagram of FIG. 7.

TABLE 1

TABLE OF INVERTER FAULTS

| | | |
|---|---|---|
| DC FAULT | 1 | DC Under voltage - not enough power to activate inverter |
| | 2 | DC Ground fault - DC output shorted to ground |
| AC FAULT | 1 | Line under frequency |
| | 2 | Line over frequency |
| | 3 | Line under voltage |
| | 4 | Line over voltage |
| INTERNAL FAULT | 1 | Inverter over temperature |
| | 2 | Start-up wait period |

A module fault is when there is no inverter fault and the module is under-delivering DC power to the inverter. This condition will happen if the module experiences reduced sunlight as compared to other modules in the same cluster or the PV laminate is malfunctioning (note: it is more likely that the fault is due to reduced sunlight since the PV laminates are very reliable). However, a PV laminate malfunction could mimic a reduced sunlight condition. For the purpose of this invention, module faults include but are not limited to: shading, snow cover, soiling, modules in multiple orientations in a cluster, and hot module due to poor module air venting.

Figure 8A:
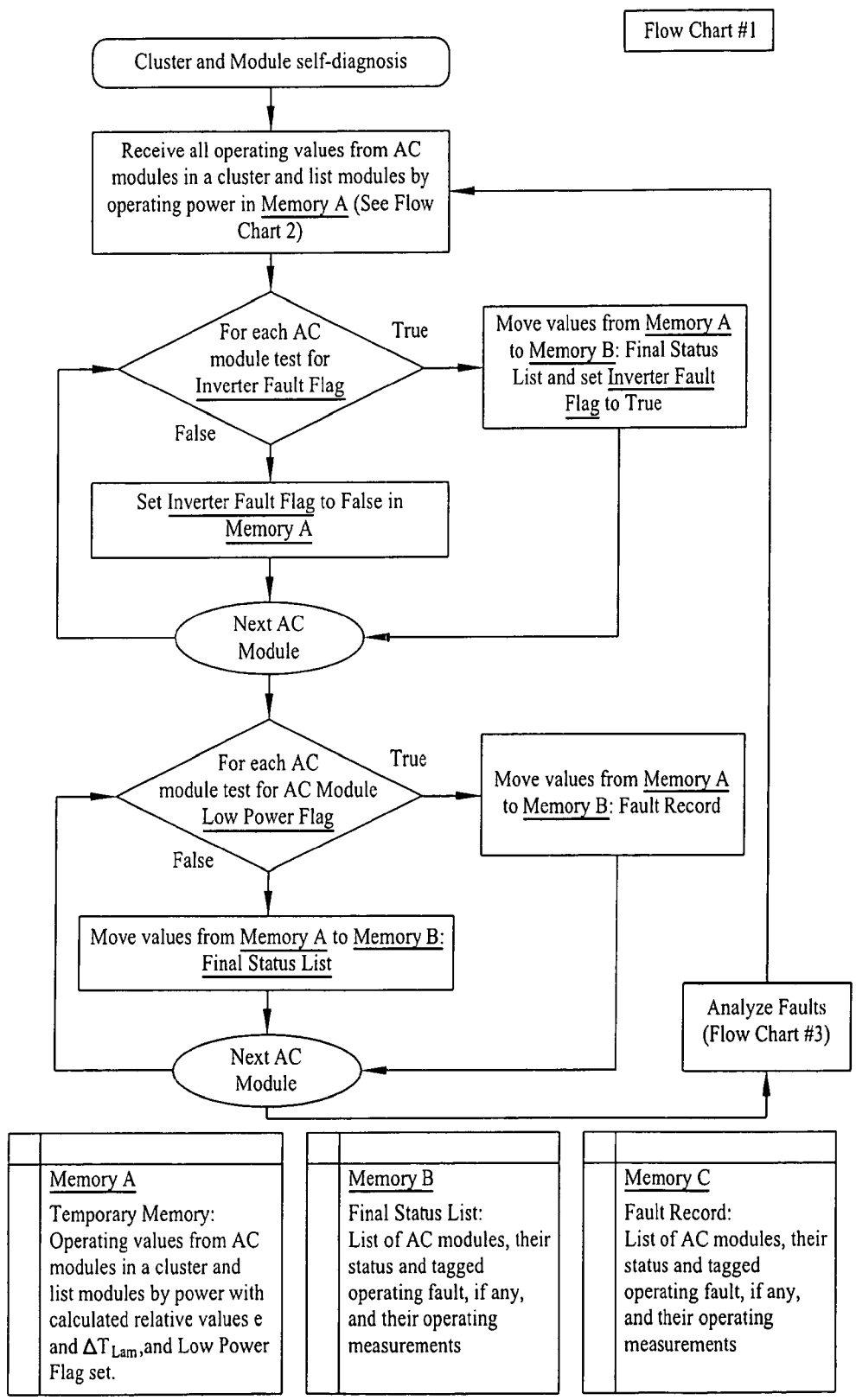
FIGS. 8A to 8E are five flow charts of the module and module cluster self-diagnosis software program embodied in the junction box for each cluster of AC PV modules.
Figure 8B:
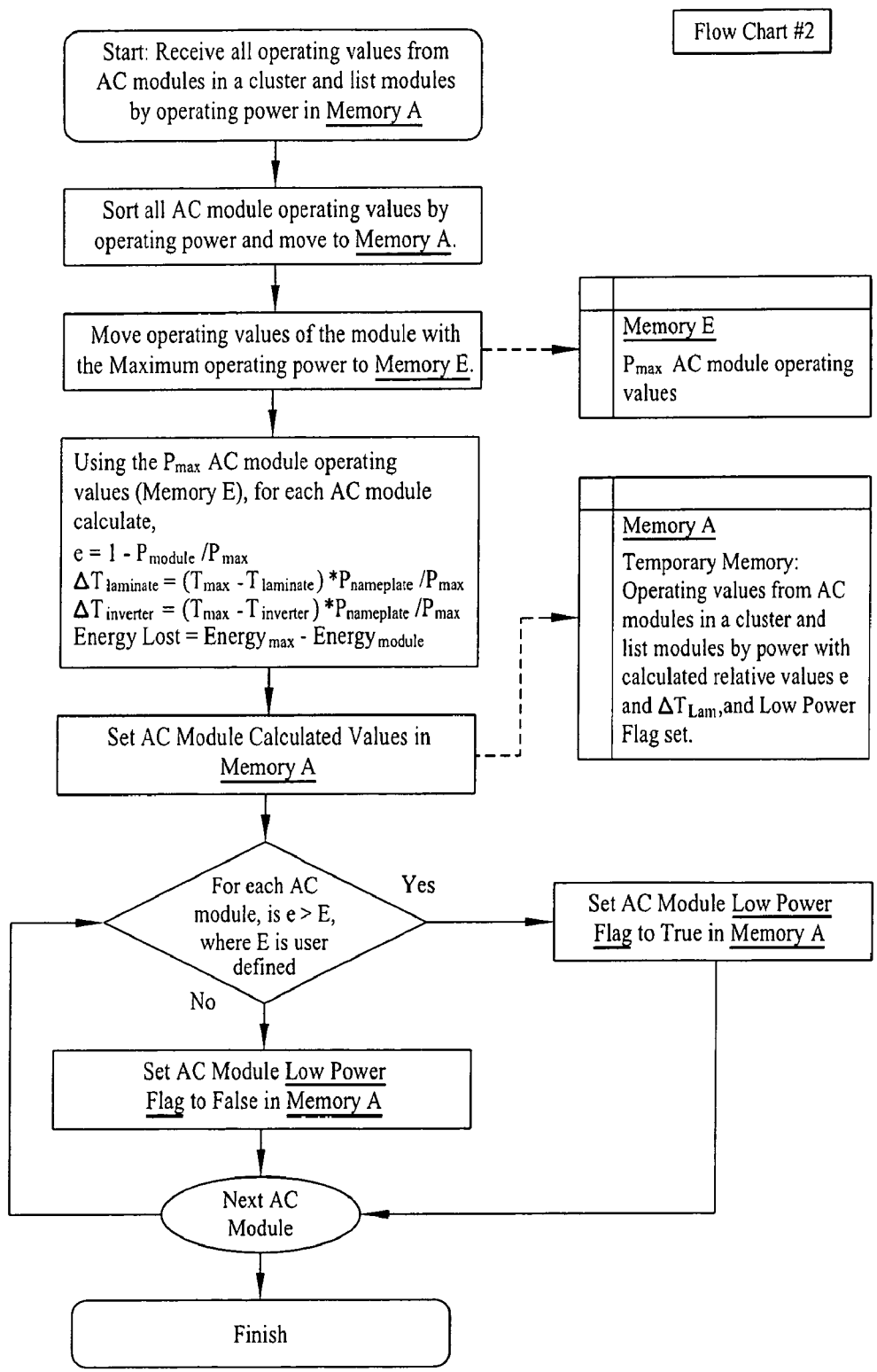

FIGS. 8A-8E are flow diagrams, identified as Flow Charts #1-5, that illustrate the operations involved in cluster and module diagnosis conducted pursuant to a computer program installed in each datalogger 88. FIGS. 8A and 8B relate to self-diagnosing modules and clusters, while FIGS. 8C-8E relate to analyzing the faults of modules deemed to be faulty.

As shown by FIGS. 8A and 8B (Flow Charts #1, #2), the microprocessor of the datalogger is programmed to collect all operating values from the AC modules in a cluster (array). More specifically, the micro-processor of the datalogger collects all operating values, including inverter fault flags, from the inverter units of all the modules in the cluster at predetermined intervals, e.g., each hour, every 4 hours, etc. The intervals also may be set according to the energy generated, e.g., 0.5 kWh, 1 kWh, etc. Referring to FIG. 8B, the collected operating data is sorted according to operating power output and the sorted operating data is stored in a temporary Memory A. Then the operating values of the module with the maximum operating power ($P_{max}$ AC Module) are moved to and stored in a maximum operating power values Memory E. Then, using the maximum operating power ($P_{max}$ AC Module) value as the standard, the operating values of each module in the cluster are used to calculate the value of e for that module, i.e., the power loss of that module in relation to the maximum power module, and also $\Delta T_{laminate}$ and $\Delta T_{inverter}$ for that module. Those calculated values for each module are then stored in a temporary Memory A. Then the calculated power loss e of each module is compared to a user defined value E. If the value of e exceeds the value of E, a low power flag for that module is set in temporary Memory A.

Figure 8C:
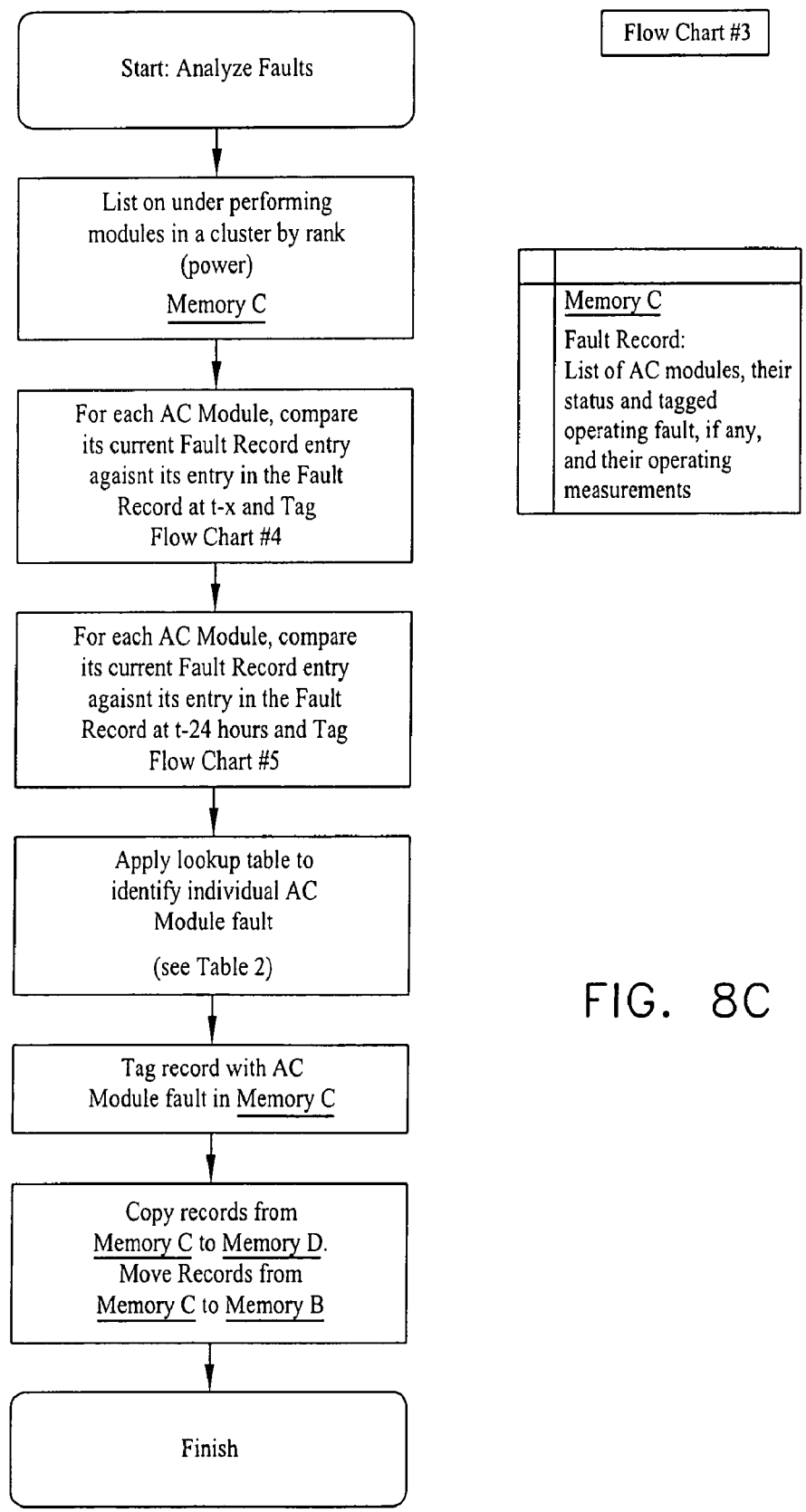

Referring again to FIG. 8A, the operating values of each module stored in Memory A are tested to determine if the module is characterized by an inverter fault flag. If a module has been flagged for an inverter fault, its operating values are moved from temporary Memory A to a Final Status List Memory B, together with an inverter fault flag. Each module that has no inverter fault is then tested with respect to its power level to determine if it is characterized by a low power flag. The values of each module with a low power flag are then transferred from Memory A to Fault Record Memory C which stores those values as a fault record; while the operating values of each module with an acceptable power level are moved from Memory A to Final Status List Memory B. Still referring to FIG. 8A (Flow Chart #1), each underperforming (low power) module is then subjected to a fault analysis according to the procedure illustrated by Flow Charts #3-5 (FIGS. 8C-8E).

Figure 8D:
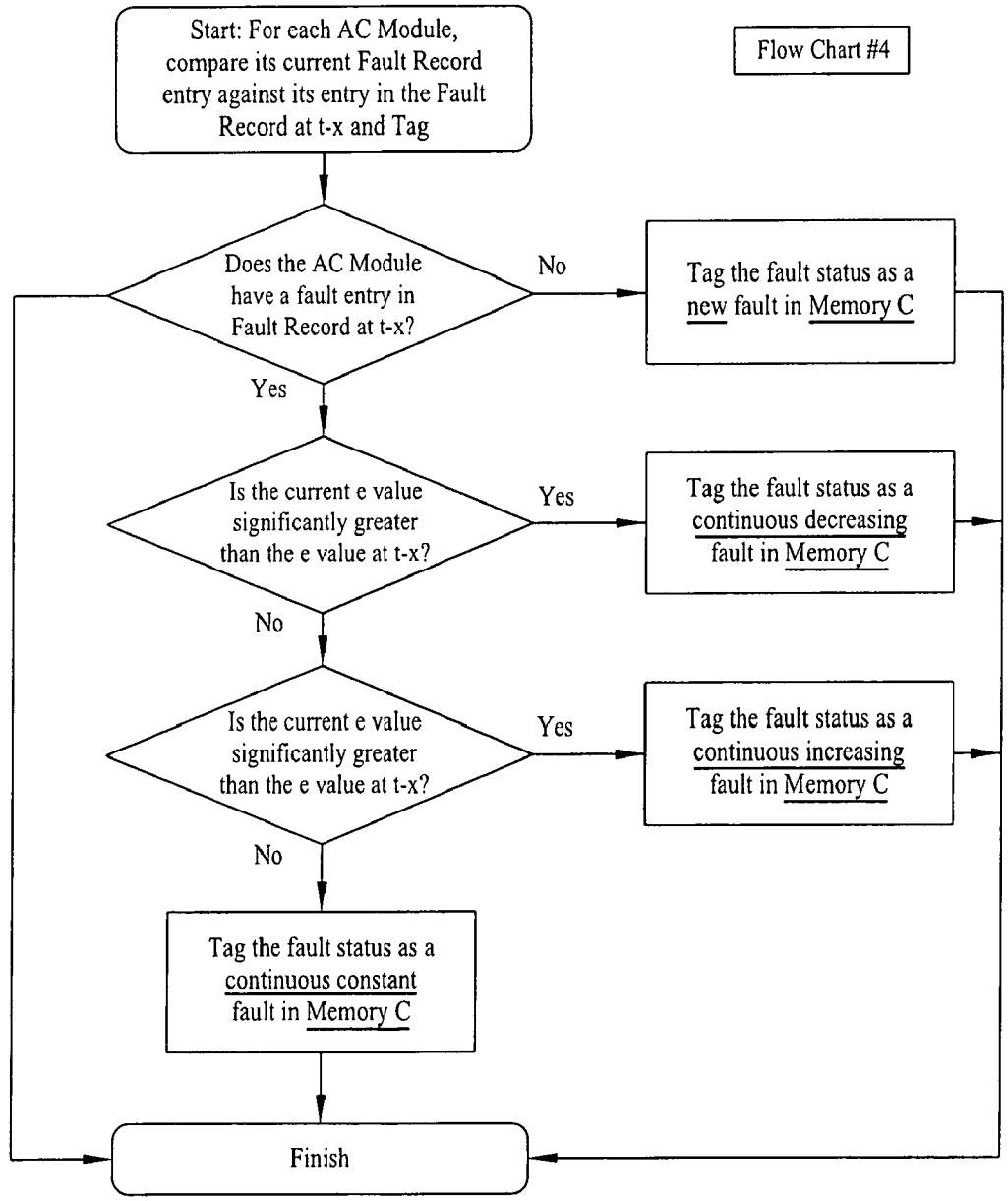

Referring to Flow Chart #3 (FIG. 8C), the fault analysis of underperforming modules with a fault flag starts with a comparison of its current data entry in Fault Record Memory C against its prior data entry at a time t-x in a Fault Record Memory D created according to the procedure illustrated by FIG. 8D (Flow Chart #4). As used herein, the term "time t-x" means a same day time prior to the time of the current values. Referring to FIG. 8D, if Memory D does not contain a prior same day fault record entry at time t-x for the module, the current data is tagged as a "new fault" and stored in Fault Record Memory C. If Memory D does contain a prior fault entry record, a comparison is made between the current power loss value e and the power loss value e at time t-x. If the current e value is significantly lesser, the current data is tagged in Fault Record Memory C as a "continuous decreasing fault". If the current e value is significantly greater, the current data is tagged in Fault Record Memory C as a "continuous increasing fault". If the difference between the values of e currently and at prior time t-x is neither significantly lesser or greater, the current data is tagged in Fault Record Memory C as a "continuous constant fault".

Figure 8E:
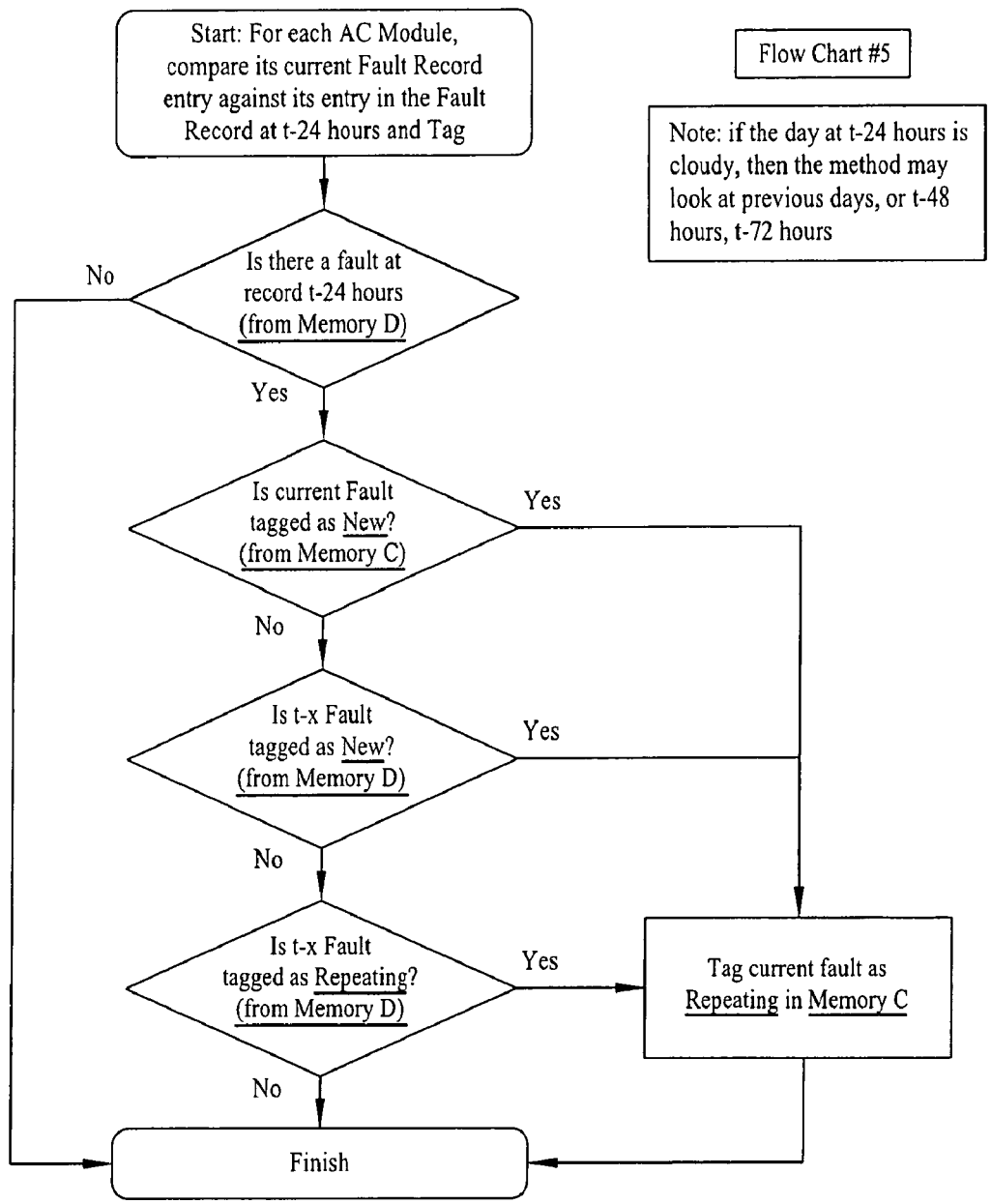

Referring again to FIG. 8C (Chart #3), a further comparison is made of current fault record entry of each module with the fault record entry, if any, at time t-24 hrs according to the procedure illustrated by FIG. 8E (Flow Chart #5). If a module has a fault entry record at time t-24 hrs, in Fault Record Memory D, a determination is then made as to whether or not the current fault is tagged as a new fault in Fault Memory C. If "yes", then the current fault is tagged as a repeating fault and the current values are stored in Memory C and flagged as a repeating fault. If "no", then an inquiry is made as to whether or not the t-x fault stored in Memory D is tagged as new. If "yes", then the current fault is tagged as repeating and stored in Memory C. If "no", than an inquiry is made as to whether or not the t-x fault is tagged as repeating in Memory D. If "yes", then the current fault is tagged in Memory C as a repeating fault.

It should be noted that if the sky at time t-24 hours was cloudy, the data at time t-24 hours would not be typical for a sunny day. In such event the procedure illustrated by FIG. 8E is modified by the microprocessor to look at data recorded at an earlier day, e.g., at time t-48 or t-72 hours, when the sun was shining.

Referring again to FIG. 8C (Chart #3), for each module found to have a fault, the microprocessor applies the following lookup table to determine the closest matching signatures for shade, snow, etc. to determine the appropriate module fault tag.

TABLE 2

LOOKUP TABLE FOR TAGGING MODULES FOR FAULTS

| Module Fault Tag | Fault Status | $\Delta T_{laminate}$ | Ambient Temperature |
|---|---|---|---|
| Shade on Module | Repeating | Positive | NA |
| Snow on Module | Continuous Decreasing | Positive | At or below freezing |
| Excessive Soiling On Module | Continuous Increasing | Near Zero | NA |
| Module Out Of Orientation | Repeating | Near Zero | NA |
| Hot Module | Continuous Constant | Negative | NA |

That appropriate tag is then added to the record of that module in Fault Memory C. The following table illustrates the content of a module fault record.

TABLE 3

MODULE FAULT RECORD

AC Module Number - identifies module
Fault Status
   New Fault
   Continuous constant power loss fault
   Continuous increasing power loss fault
   Continuous decreasing power loss fault
   Repeating fault - fault occurred t-24, t-48, t-72 hrs
Power loss (e)
Compare energy from Pmax module with low power module over interval
   Energy lost = Energy$_{max}$ - Energy$_{module}$
$\Delta T_{laminate}$:
   $\Delta T_{laminate}$ is significantly positive; tested module is running cold
   $\Delta T_{laminate}$ is significantly negative; tested module is running hot
   $\Delta T_{laminate}$ is neither significantly positive or negative; tested module normal
Ambient temperature:
Module Fault Tag
   None
   Snow on Module
   Shade on Module
   Excessive Soiling On Module
   Module Out Of Orientation
   Hot Module Referring again to FIG. 8C (Flow Chart #3), after each module has been tagged with a fault from Table 2, the record of that module in Memory C is copied to Fault Records Memory D and also transferred to Final Status List Memory B.

The following Table 4 illustrates the final status list for a module stored in Final Status List Memory B.

TABLE 4

Final Status List Table
Final Status List

| | |
|---|---|
| AC module number: | (identifies module) |
| Operating Status: | Running, Sleep, Fault |
| Inverter Status: | Running, Fault (from Table 1) |
| Module Status: | Running, Fault tag (from Table 3) |
| Fault Status: | New Fault |
| | Continuous Constant Power Loss Fault |
| | Continuous Increasing Power Loss Fault |
| | Continuous Decreasing Power Loss Fault |
| | Repeating Fault - Fault Occurred t-24, t-28, 7-72 hrs. |
| Power Loss (e) | |
| Energy Lost - Compared to Pmax energy | |
| $\Delta T$ laminate: | |
| | Significantly Positive - tested module running cold |
| | Significantly Negative - tested module running hot |
| | Neither Significantly Positive Nor Negative - module tested normal |
| Ambient Temperature | |

The information stored in the Final Status List can be accessed selectively to generate a user display containing the results of the diagnosis. Table 5 below illustrates a typical display of the results of a diagnosis.

TABLE 5

Fault Display

| | |
|---|---|
| Date | (xx/xx/xxxx) |
| Fault Type | (Inverter or Module) |
| Fault Tag | From Inverter Fault List or Module Fault Tag List |
| Total Energy Loss | #kWh |

| List Of AC Modules With Faults | | |
|---|---|---|
| AC Module Number | Energy Loss | Event Duration |
| Module No. (xxxxxx) | kWh | Hours |
| Module No. (xxxxxx) | kWh | Hours |

Further with respect to Tables 2 and 3, the operation of the microprocessor of the datalogger in looking at the Fault Record to find the closest matching signatures for shade, snow, etc. to determine the AC module fault tag is unique. Also at the cluster level, the microprocessor summarizes the daily energy lost to each fault tag and compares it to previous days to determine if the cluster energy loss signature is compatible with the energy loss tags. The shade signature is significant in that shade causes a module to run cool. Also it is a repeating module level fault. On a cluster level, shade on part of the cluster of AC modules results in low power events in a subset of AC modules. Moreover the subset of low power AC modules changes over the day. Shading also is a pattern that repeats itself every day but which may change over a month due to the change in the sun's path over the year. Hence the cluster energy loss is a repeating phenomenon.

At a module level, snow causes a continuous decreasing power loss fault, indicative of a module running cool while the ambient temperature is near freezing. At a cluster level, the snow generally starts out covering all of the modules in the cluster. However, as the snow melts it exposes areas of the modules, allowing for diagnosis of low power modules. On a cluster level, the number of low power AC modules in a cluster changes over the day. However, snow cover is not a pattern that repeats itself every day, so that eventually all of the AC modules in a cluster become fully exposed and operate correctly.

At the module level, excessive soiling causes a continuous increasing power loss fault. However, the $\Delta T_{laminate}$ value is near zero. At the cluster level, completely even soiling is not possible to detect unless a clean sunlight sensor is available for comparison. However, uneven soiling is diagnosable. On a cluster level, the set of low power AC modules is constant over the day and is repeatable day-to-day. A rain event may resolve the uneven soiling or contribute to it. Accordingly on a cluster level the energy loss is characterized as increasing power loss fault.

The signature for a module having a different orientation than other modules in a cluster is that on a module level it is a repeating fault with a $\Delta T_{laminate}$ value near zero. On a cluster level, if a set of AC modules in a cluster is oriented differently, but not radically differently from other modules in the same cluster, diagnosis is possible. On a cluster level, the power output of a set of low power AC modules changes over the day. However, low power is a pattern that repeats itself every day. The level of power the AC modules experience may change over a month due to the change in the sun's path over the year. The difference between a differently-oriented AC module and a shaded module is that a differently-oriented AC module will operate proportionally to the sun's intensity over the day, while the shaded module will operate near zero power when it is shaded. The cluster energy loss is repeating for the set of low power AC modules.

With respect to the hot module signature, the mounting or placement of AC modules on a roof may be such that some modules in a cluster may experience a higher laminate operating temperatures than other AC modules in the same cluster, usually as a result of different air flow over and under the individual modules. The higher laminate temperatures result in a negative $\Delta T_{laminate}$, with the result that each module will show a continuous constant power loss that may scale with increasing ambient temperature. On a cluster basis, the energy loss is constant.

Figure 9:
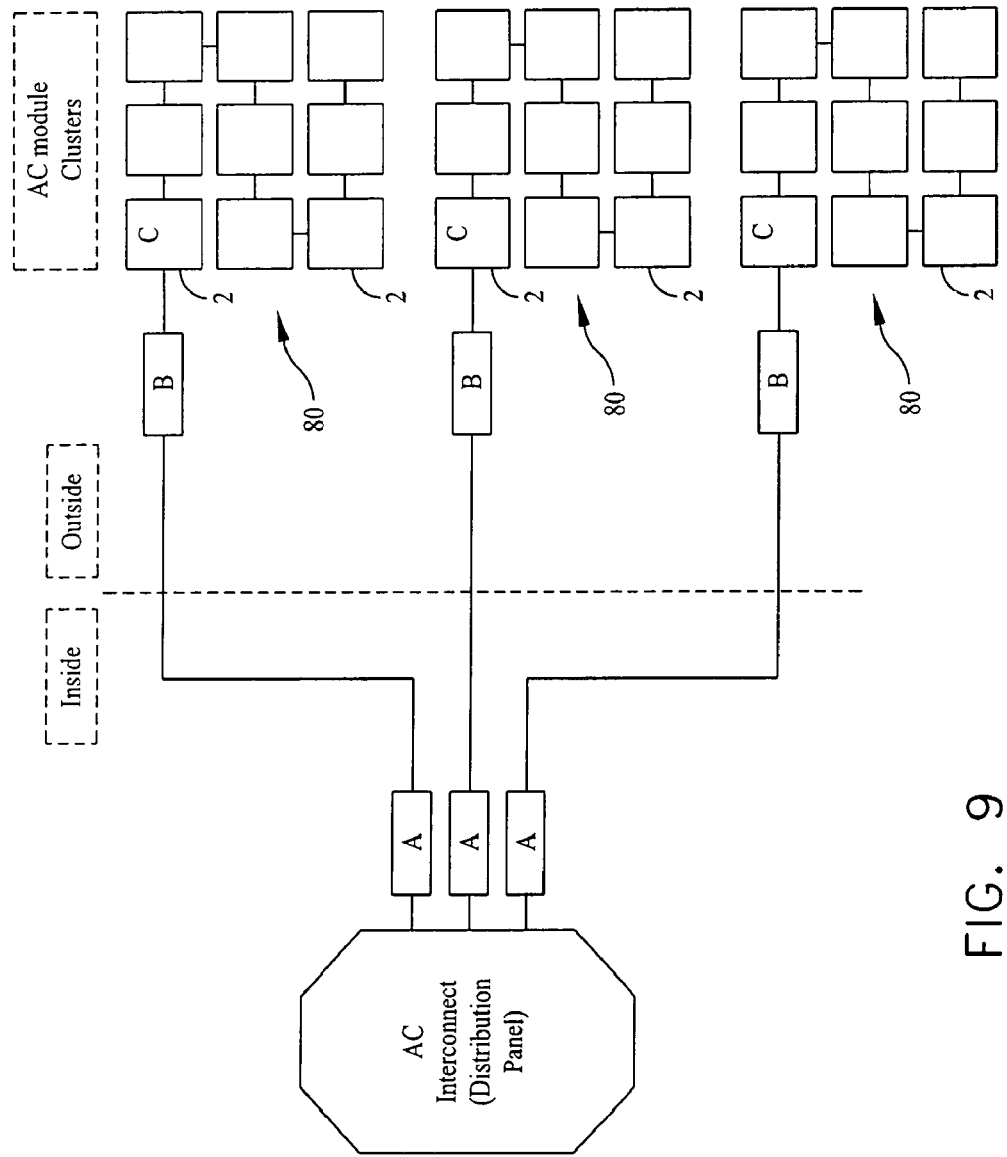
FIG. 9 is a modification of FIG. 5 presented to illustrate two alternative embodiments of the invention.

FIG. 9 is a modification of FIG. 5 presented to illustrate two alternative embodiments of the invention. Essentially FIG. 9 illustrates three different scenarios based on locations of equipment and functions at three different locations, identified as A, B, and C. Location A is away from the area where the clusters of modules are mounted, e.g., inside the building on which a PV power generating system is mounted, preferably not necessarily near the distribution panel that serves as the interconnect to a power grid. Location B is near the location of the module cluster. Location C is at the AC PV modules.

The first scenario is the embodiment described above, with location B being that of the junction box, a location close to one of the clusters of modules. In this scenario, each junction box at location B embodies the following capabilities and functions: (1) datalogging and storage 90, (2) wireless interface 94, (3) powerline communication 92, (4) AC filter 102 to reduce the noise from the grid, (5) ambient temperature sensor 100, and (6) junction box wire transition from PV installation to grid.

The second scenario is an alternative embodiment of the invention. In this scenario, the following capabilities and functions are transferred to location A: (1) data logging and storage 90, (2) wireless interface 94, (3) powerline communication 92, and (4) AC filter 102 to reduce the noise from the grid. Retained at location B are (1) the ambient temperature sensor 100 with a powerline connection to the datalogger at location A, and (2) the junction box wire transition from PV installation to grid.

The third scenario constitutes a second and preferred alternative embodiment of the invention. This scenario consists of doing the following: moving to location A the following: (1) wireless interface 94, (2) powerline communication 92, and (3) AC filter 102 to reduce noise from the grid; keeping at location B the following: (1) the ambient temperature sensor 100 with powerline connection to the master inverter (hereinafter identified) among the dedicated inverters in the cluster of modules and (2) the junction box wire transition; and moving to location C the data logging and storage functions of datalogger 88. In this second and preferred alternative embodiment, the separate dataloggers 88 are eliminated and the above-described software program responsible for the data processing and storage functions of datalogger 88 is incorporated into each of the inverters of the AC PV modules. In this second and preferred embodiment of the invention, the inverter of one AC PV module in each cluster is programmed to act as a master, in which capacity it does the following: (1) receives operating data from the inverters of the other modules in the same cluster and also from external temperature sensor 100, (2) processes, summarizes and stores that data and also its own operating data in the manner described above with respect to operation of datalogger 88, and then sends the processed and summarized information of each of the other modules back to those modules where it is stored. The master inverter also transmits the processed and summarized information to the wireless interface 94 at location A, whereby it is sent wirelessly to one or more data collection devices 96.

The attributes and advantages of the apparatus and system hereinabove described are many. Networking the junction box dataloggers aggregates the cluster self-diagnosis into a total datalogging system. This hierarchical system, from AC PV module to cluster to total photovoltaic AC power generating network, maintains the informational value of the clusters, while providing a systematic method to aggregate an entire installation of AC PV module clusters at one location. This method of aggregating data into a system scales as the system grows, all the while preserving the individuality of each AC PV module from the standpoint of being able to identify each module by its serial number, date of manufacture, and warranty information and also its factory-characterized parameters (Voc, Isc, Vmp, Imp, Pmp), all of which is stored in the module's own inverter.

Each inverter unit has a power line communications circuit connected to the AC line side of the inverter, and using the existing AC cabling to deliver AC module data to the junction box datalogger, or to a master inverter as described above in relation to the second and preferred alternative embodiment, reduces the need for additional wires or penetrations out of the inverter enclosure. The power line filter 102 prevents power line noise from the grid and building on the AC power bus from affecting the datalogger performance. Without the noise, the isolated AC power bus becomes a more reliable environment for the communication between the AC PV modules and the datalogger 88 in the junction box, and also between the modules and the wireless interface in the case of the second alternative embodiment of the invention. Using power line communications method leverages the existing cables between the AC PV modules and the junction box, eliminating the need for extra wires and eliminating further code compliance problems since commercially available inverters and dataloggers are already code compliant. Providing a sensor 100 whereby it can record temperature on the roof or other structure on which the junction box is located is advantageous in that it results in aggregation of data from AC PV modules that are alike environmentally and operationally together with the ambient temperature data from the same location.

A further attribute and advantage is that all critical information for the characterization and self-diagnosis of the system is available and stored near the cluster from which the information emanated, i.e., in the datalogger 88 dedicated to that cluster or, in the case of the third scenario described above, in the dedicated inverters. A further advantage of the invention is that it permits backup access to data stored in the inverters and/or the datalogger by a manual connection of a data collection device in the event of a failure of the wireless communications system. The advantage of this backup access to the data is to provide a system lifetime access to the diagnostic and historical data. It is intended also for each microprocessor-based datalogger, or master inverter in the case of the second alternative embodiment described above, to act as an administrator capable of receiving uploaded firmware upgrades and sending the same to the inverters of all AC PV modules in the cluster.

Another advantage is that the junction box microprocessor datalogger is equipped with a network connection that can be linked together into a wireless network capable of communicating the sum of all self-diagnostic and cluster diagnostic data to one point/device on the network. If there are many nodes on the network, information can travel between nodes and effectively increase the distance that one node can communicate with the master device on the network. Transmitting the collected and summarized data to a remote data collection device makes it possible to provide assurance of safe storage of historical data from the system of several clusters. Also the remote data collection device may be equipped with a secondary communications method to forward information on to another device, i.e., acting like a gateway.

The self-diagnosis provided by the present invention not only collects the key performance characteristics of each AC PV module in the cluster and compares their relative performance, including tagging those with faults determined from analysis of low performance data, but also offers the advantage that the comparison may include consideration of data of module and cluster performance at relevant prior times, e.g., prior 24 hours, 48 hours, 72 hours, and longer.

A further advantage is that the programmable inverters and dataloggers having the attributes of the inverter unit shown in FIG. 4 and the datalogger 88 shown in FIG. 6 are available commercially and offer the advantages of being electrical code compliant and available in various electrical power ratings and footprints.

The invention also offers an advantage in that it is susceptible of modifications. Thus, for example, it is not necessary that the modules have frames surrounding the PV laminates that are characterized by box channel sections and that each module be pre-wired with an AC power bus cable that is housed in the box channel section of the frame. Instead the frame may consist of members that are U-shaped in cross-section so as to fit over the edges of the PV laminate, in which case the AC power bus cable may extend wholly outside of the frame. Additionally the PV modules may not be pre-wired at all, in which case the power bus cable must be installed at a subsequent time. It also is not essential for the inverters to be inserted into a channel in the frame of the PV module or even directly attached to the frame. However, it is essential that each inverter enclosure provide an electrical ground path in common with the PV laminate to which it is electrically connected. Also it is preferred that the inverters be physically mounted to the PV module in a manner that permits the frames to function as heat sinks for the associated inverters. It also is contemplated that the frames surrounding the PV laminates may be made of a plastic material instead of a metal, in which case heat sinking may be achieved by physically attaching the inverters to metal mounting members that are secured to the building roof and act to support the modules in selected position on the roof. Still another possible modification is to provide each inverter with a programmable wireless communications capability, whereby data can be recovered wirelessly from each module individually.

Still other advantages and modifications will be obvious to persons skilled in the art.

What is claimed is:

1. A power generating system comprising:
   a first array of two or more solar cell modules, each module comprising an inverter and a photovoltaic (PV) laminate, said PV laminate including a plurality of electrically interconnected solar cells for generating a DC power output, and said inverter electrically connected to said PV laminate for converting said DC power output to an AC power output:
   an AC power bus extending between said modules and connected to said inverter of each module for collecting the AC power output of said first array of modules; and
   a junction box electrically connected to said AC power bus; wherein said inverter is configured to:
      sense selected parameters from the group consisting of DC voltage, DC current, AC voltage, AC current, cumulative energy, inverter temperature, PV laminate temperature, and solar cell temperature;
      digitize said sensed parameters, and
      transmit sensed parameters data over said AC power bus to said junction box; and
   wherein said junction box is configured to:
      receive and store sensed parameters data transmitted by said inverters over said AC power bus;
      analyze said stored parameters data on a module basis and an array basis and store the results of the analysis; and
      transmit said digitized sensed parameters data and/or the results of said analysis to a remote receiver.

2. A power generating system according to claim 1 wherein each inverter comprises a memory device for storing sensed parameters data.

3. A power generating system according to claim 1 wherein said junction box comprises a wireless interface unit to wirelessly transmit said digitized sensed parameters data to a remote receiver.

4. A power generating system according to claim 1 wherein said junction box is serially connected to a remote receiver by a wired connection.

5. A power generating system according to claim 1 in combination with at least a second array comprising:
   two or more solar cell modules, each solar cell module of said second array including an inverter;
   a second AC power bus extending between and connected to said inverter of each module of said second array of modules for collecting the AC power output of said second array; and
   a second junction box electrically connected to said second AC power bus;
   wherein said inverters of said second array are each configured to:
      sense selected parameters related to the power output of the modules of said second array, said selected parameters being from the group consisting of DC voltage, DC current, AC voltage, AC current, cumulative energy, inverter temperature, PV laminate temperature, and solar cell temperature;
      digitize said sensed parameters; and
      transmit said sensed parameters data over said AC power bus to said junction box; and
   wherein said second junction box is configured to:
      receive and store sensed parameters data transmitted by said inverters of said second array over said AC power bus;
      analyze said stored parameters data from said second array on a module basis and an array basis and store the results of the analysis; and
      transmit said digitized sensed parameters data and/or the results of said analysis to a remote receiver.

6. A power generating system according to claim 5 wherein the AC power bus of said first array of modules is coupled with the AC power bus of said second array of modules, whereby the combined power output of said first and second arrays is available for transmission to a power grid or other electrical load.

7. A power generating system according to claim 5 wherein said second junction box comprises a wireless transmitting device for transmitting the sensed parameters data to a remote receiver.

8. A power generating system according to claim 1 further comprising an AC power line connected to said AC power bus via said junction box for transmitting the AC power output of said first array to an AC power grid, and further comprising an AC filter interposed in said AC power line downstream of said junction box for reducing the effect of grid noise on data transmitted over said AC power line.

9. A power generating system according to claim 1 wherein said modules are mounted to a roof in proximity to one another in substantially like angular positions relative to the roof and experiencing similar environmental conditions, and wherein said junction box is configured to diagnose operational faults.

10. A power generating system according to claim 1 wherein at least one module includes a frame surrounding and supporting its PV laminate, and wherein said module's inverter is mounted to said frame.

11. A power generating system according to claim 10 wherein said frame is made of metal and functions as a heat sink for said inverter.

12. A power generating system according to claim 11 wherein said inverter has an enclosure that functions as a ground path in conjunction with said frame.

13. A power generating system according to claim 10 wherein said frame comprises a channel having a first wall defining a periphery of said at least one module and a second wall disposed inwardly and running parallel to said first wall, and wherein said inverter is mounted in an opening in said second wall.

14. A power generating system according to claim 1 further comprising a temperature sensor connected to said PV laminate for sensing the temperature of said PV laminate and configured to transmit the temperature sensed by said sensor to said inverter for digitizing and transmittal to said junction box for storage.

15. A power generating system according to claim 1 wherein said junction box is configured for diagnosing inverter faults.

16. A power generating system according to claim 15 wherein said inverter faults consist of one or more of the following: insufficient DC voltage, DC ground fault, AC under frequency, AC over frequency, insufficient AC voltage, excessive AC voltage, inverter excess temperature, and inverter start-up wait period.

17. A power generating system according to claim 1 wherein said junction box is configured to identify module faults caused by one of the following conditions: module shading by vegetation or other factor, snow cover, soiling of the sun-receiving surfaces of the modules, excessive module temperature due to insufficient air venting, and modules in an array having differences in their orientation relative to the sun.

18. A power generating system according to claim 17 wherein said junction box is configured to compare operating values of the modules in the first array to one another and to operating values of the modules in the first array at an earlier time.

19. A method for acquiring operating and environmental data from an array of photovoltaic (PV) modules, each module including a power output section and a dedicated inverter connected to the power output section, said method comprising:
   (a) operating each inverter to convert a DC output of the module to which it is dedicated to an AC output, measuring the current and voltage values of said DC and AC outputs, the inverter temperature, and the temperature of a PV laminate component of the module, converting the measured values and temperatures to digital data, and storing said digital data in said inverter;
   (b) providing said AC output from each inverter to a common AC power output bus for delivery to a load;
   (c) transmitting said stored digital data from said inverter to a computer controlled datalogger over said common AC power bus aided by an AC filter designed to eliminate interference of said digital data by AC grid noise;
   (d) selectively evaluating, by the datalogger, the stored digital data from each inverter to determine inverter DC faults, AC faults, and internal faults and storing the results of the evaluation; and
   (e) selectively evaluating, by the datalogger, the stored digital data from each module to determine module faults resulting from one or more of the following: snow accumulation, shading of module, soiling of module front face, high module temperature, and non-uniform orientation of modules in the array, and storing the results of the evaluation.

20. A method according to claim 19 wherein said inverter DC faults comprise DC voltage below a predetermined minimum and a DC ground fault, and said AC faults comprise at least one of: an AC frequency below a predetermined limit, an AC frequency above a predetermined limit; an AC voltage below a predetermined limit, and an AC voltage above a predetermined limit.

21. A method according to claim 19 wherein said internal faults consist of inverter excess temperature and an inverter start-up period.

22. A photovoltaic power generating apparatus comprising:
   a plurality of PV modules clustered together in an array, each of said modules comprising:
      a PV laminate that converts solar energy to a DC power output;
      an inverter electrically connected to the PV laminate and structured to convert the DC power output of said connected PV laminate to an AC power output, and
   an AC power bus connected to said inverters for combining the AC power outputs of said inverters;
   wherein each inverter comprises:
      a microprocessor for controlling operation of said inverter and for converting current values of the DC power output and the AC power output to power output data of each inverter in digital form;
      a memory device for storing said power output data, inverter temperature data representing a temperature of each inverter, and laminate temperature data representing a temperature of the PV laminate to which each inverter is connected; and
      a transmitting device for transmitting said power output data, said inverter temperature data, and said laminate temperature data over said power bus; and
   a datalogger configured to:
      receive the transmitted data via said power bus;
      store the transmitted data;
      compare the transmitted data to data received at an earlier time;
      determine inverter and module faults on the basis of the comparison;
      store the results of the comparison; and
      transmit the data and the stored results to a separate data collection device.

23. A photovoltaic power generating apparatus according to claim 22 wherein said datalogger transmits the data and the stored results to a separate data collection device by a wireless transmitting device.

24. A method for acquiring operating and environmental data from a cluster of PV modules where each module is configured to generate a DC power output in response to received solar radiation, said method comprising the following steps:
   (a) converting the DC power output of each PV module individually to an AC power output using a separate dedicated inverter for each PV module;
   (b) collecting the AC power output of all of the modules in said cluster via a common AC power bus;
   (c) for each PV module, measuring a voltage, an electric current, and energy values of the DC and AC power outputs, a current temperature of the PV module, and a current temperature of its dedicated inverter;
   (d) storing the measured values and said temperatures for each PV module in the form of digital format data at the site of said PV module;
   (e) transmitting said digital format data from the PV modules of said cluster to a cluster data collection point;
   (f) storing said digital format data from all of said PV modules at said cluster data collection point;
   (g) at said cluster data collection point, evaluating said digital format data to determine faults occurring in step (a);
   (h) at said cluster data collection point, comparing said digital format data from each PV module with the digital format data of the other PV modules in the cluster, and comparing said digital format data with like digital format data derived from said PV modules at a previous time to evaluate individual and relative performance of the modules in the cluster to determine event-caused performance faults; and
   (i) recording all of said faults.

25. A method according to claim 24 wherein said data collection point comprises a datalogger.

26. A method according to claim 25 wherein said AC power output is transmitted by said AC power bus to an electricity-using grid, and wherein in step (e) said data is transmitted to said data logger via said AC power bus.

27. A method according to claim 25 wherein said datalogger is embodied in the dedicated inverter of one of said modules.

28. A method according to claim 24 further comprising transmitting all of said digital format data and data identifying said faults to a data collection device at a location remote from said PV modules and said datalogger.

29. A method according to claim 28 wherein the transmission of said digital format data and data identifying said faults to said data collection device is accomplished wirelessly.

30. A method for acquiring operating and environmental data from a cluster of n AC PV modules, where n is a number greater than 1 and each module is configured to generate a DC power output in response to received solar radiation and includes a dedicated inverter for converting said DC power output to an AC power output, said method comprising the following steps:
   (a) converting the DC power output of each PV module to an AC power output using the dedicated inverter for said each AC PV module;
   (b) for each AC PV module, measuring a voltage, an electric current, and energy values of said DC and AC power outputs, a current temperature of said each AC PV module, and a current temperature of its dedicated inverter;
   (c) storing said values and said temperatures for each AC PV module in the form of digital format data at the site of said AC PV module;
   (d) evaluating said digital format data of all of said n AC PV modules on a module by module basis to determine faults occurring in step (a);
   (e) comparing said digital format data of said AC PV modules to determine those AC PV modules that fail to meet a predetermined power output level;
   (f) comparing said digital format data of those AC PV modules that fail to meet said predetermined power output level with like digital format data derived from those AC PV modules at a previous time to determine and characterize event-caused performance faults; and
   (g) recording data indicative of all of said faults in memory.

31. A method according to claim 30 wherein said steps (d) to (f) are carried out in a data logger spaced from said n AC PV modules.

32. A method according of claim 30 wherein steps (d) to (f) are carried out by the dedicated inverter of one of said n AC PV modules.

33. A method according to claim 32 wherein said recorded data is transmitted by said dedicated inverter of said one AC PV module via an AC power bus to a wireless interface capable of transmitting data wirelessly to a remote collection device, and wherein said AC power bus also carries the combined AC power outputs of said n AC PV modules.

34. A method according to claim 30 further including transmitting said recorded data indicative of said faults to a remote data collection device.

35. A method according to claim 30 wherein said recorded data indicative of said faults is transmitted wirelessly to a remote collection device.

* * * * *